United States Patent
Oda et al.

(10) Patent No.: US 8,849,128 B2
(45) Date of Patent: Sep. 30, 2014

(54) MULTI-WAVELENGTH LIGHT SOURCE

(75) Inventors: Shoichiro Oda, Kawasaki (JP); Takeshi Hoshida, Kawasaki (JP); Toshiki Tanaka, Kawasaki (JP); Takahito Tanimura, Kawasaki (JP); Tomoo Takahara, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 353 days.

(21) Appl. No.: 13/413,874

(22) Filed: Mar. 7, 2012

(65) Prior Publication Data
US 2012/0243880 A1 Sep. 27, 2012

(30) Foreign Application Priority Data
Mar. 25, 2011 (JP) ................. 2011-068869

(51) Int. Cl.
H04B 10/04 (2006.01)
H04J 14/02 (2006.01)
H04B 10/548 (2013.01)
H04B 10/50 (2013.01)
H01S 5/00 (2006.01)
H01S 5/40 (2006.01)

(52) U.S. Cl.
CPC ............ *H04B 10/506* (2013.01); *H01S 5/005* (2013.01); *H04B 10/548* (2013.01); *H01S 5/0085* (2013.01); *H01S 5/4087* (2013.01)
USPC ............. 398/187; 398/79; 398/182; 398/183; 362/231

(58) Field of Classification Search
CPC . H04B 10/505; H04B 10/5563; H04B 10/548
USPC ......................................... 398/182, 183, 187
See application file for complete search history.

(56) References Cited

U.S. PATENT DOCUMENTS 5,999,547 A * 12/1999 Schneider et al. ............. 372/21
7,522,844 B2 4/2009 Kawanishi et al.
(Continued)

FOREIGN PATENT DOCUMENTS

JP 10-93164 4/1998
JP 2000-47278 2/2000
(Continued)

OTHER PUBLICATIONS

Masayuki Izutsu et al., "Integrated Optical SSB Modulator/Frequency Shifter", vol. QE-17, No. 11, Nov. 1981, pp. 2225-2227.
(Continued)

Primary Examiner — Oommen Jacob
(74) Attorney, Agent, or Firm — Fujitsu Patent Center

(57) ABSTRACT

Light output from a seed light source generation unit that outputs continuous light having a single frequency or a plurality of frequencies is input by a multi-wavelength light source to an optical circulation unit, and light having a plurality of frequencies that is frequency-synchronized with seed light output from the seed light source generation unit is generated. The optical circulation unit is provided with an optical frequency shifter to shift light frequencies, and includes a circulation circuit to return output from the optical frequency shifter to the input side. On a circulation path, an optical spectral shaper capable of adjusting an optical amount of attenuation for each frequency unit is provided so that optical amount of attenuations are adjusted, and thereby the number and the like of optical frequencies output from the optical circulation unit are changed.

20 Claims, 30 Drawing Sheets

(56) References Cited

U.S. PATENT DOCUMENTS

| | | | |
|---|---|---|---|
| 7,962,039 | B2 | 6/2011 | Kawanishi et al. |
| 2001/0012144 | A1 | 8/2001 | Miyazaki et al. |
| 2006/0198406 | A1* | 9/2006 | Seeds ............................ 372/32 |
| 2009/0310968 | A1* | 12/2009 | Kawanishi et al. ............. 398/79 |
| 2011/0134940 | A1* | 6/2011 | Hartog .............................. 372/6 |
| 2012/0243880 | A1* | 9/2012 | Oda et al. ...................... 398/187 |

FOREIGN PATENT DOCUMENTS

| JP | 2005-77584 | 3/2005 |
|---|---|---|
| JP | 2006-17748 | 1/2006 |

OTHER PUBLICATIONS

Bernard Désormière, et al., "An Integrated Optic Frequency Translator for Microwave Lightwave Systems", Journal of Lightwave Technology, vol. 8, No. 4, Apr. 1990, pp. 506-513.

Kyoji Shibuya et al., "10-GHz-Order High-Efficiency Electrooptic Frequency Shifter Using Slant-Periodic Domain Inversion", IEEE Photonics Technology Letters, vol. 16, No. 8, Aug. 2004, pp. 1939-1941.

Toshiaki Suhara, "Fundamentals of a Semiconductor Laser", Mar. 1998, pp. 230-233.

M. Prevedelli, et al., "Phase locking of grating-tuned diode lasers", Appl. Phys. B 60 (1995), pp. S241-S248.

Glen Baxter, et al., "Highly Programmable Wavelength Selective Switch Based on Liquid Crystal on Silicon Switching Elements", Mar. 5, 2006.

Soichi Kobayashi, et al., "Injection Locking in AlGaAs Semiconductor Laser", IEEE Journal of Quantum Electronics, vol. QE-17, No. 5, May 1981, pp. 681-689.

Kawanishi, Tetsuya et al., "Multi-channel RoF signal generation using a reciprocating optical modulator," IEEE, Oct. 5, 2010, pp. 235-237, XP031832921.

Morohashi, Isao et al., "Broadening of Comb bandwidth by Multiple Modulation using Feedback Loop in Mach-Zehnder-Modulator-Based Flat Comb Generator," Microwave Photonics, IEEE, Oct. 5, 2010, pp. 220-223, XP031832407.

Extended European Search Report dated Jul. 25, 2012 for corresponding European Application No. 12154005.8.

* cited by examiner

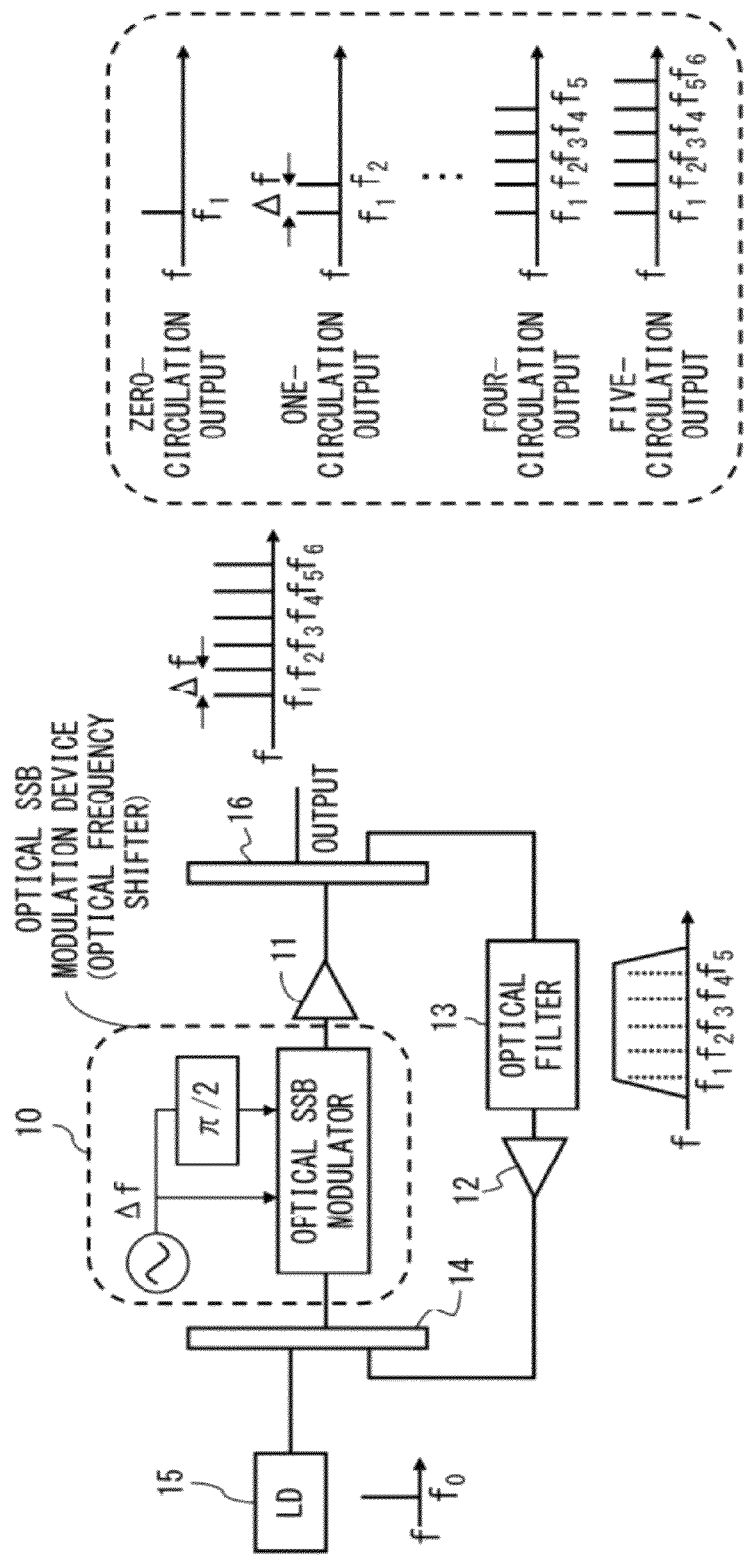

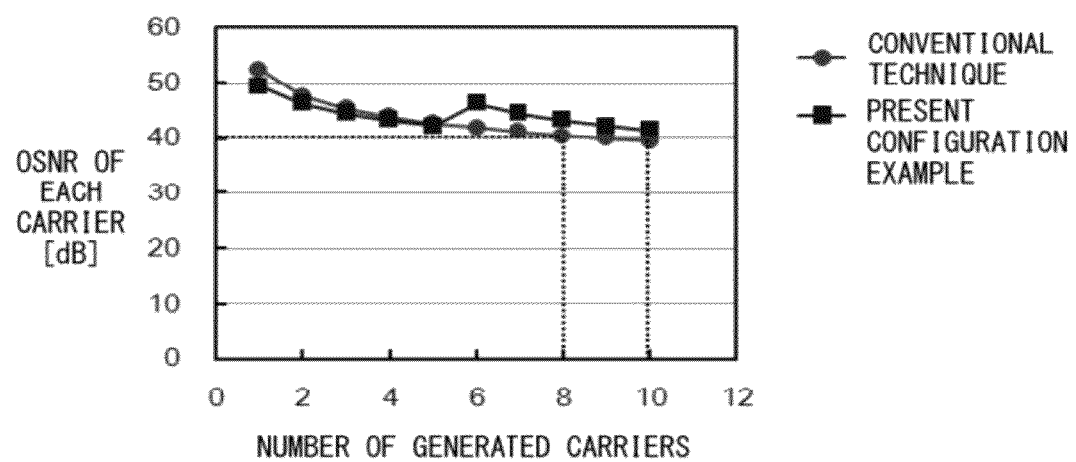
F I G. 1 2

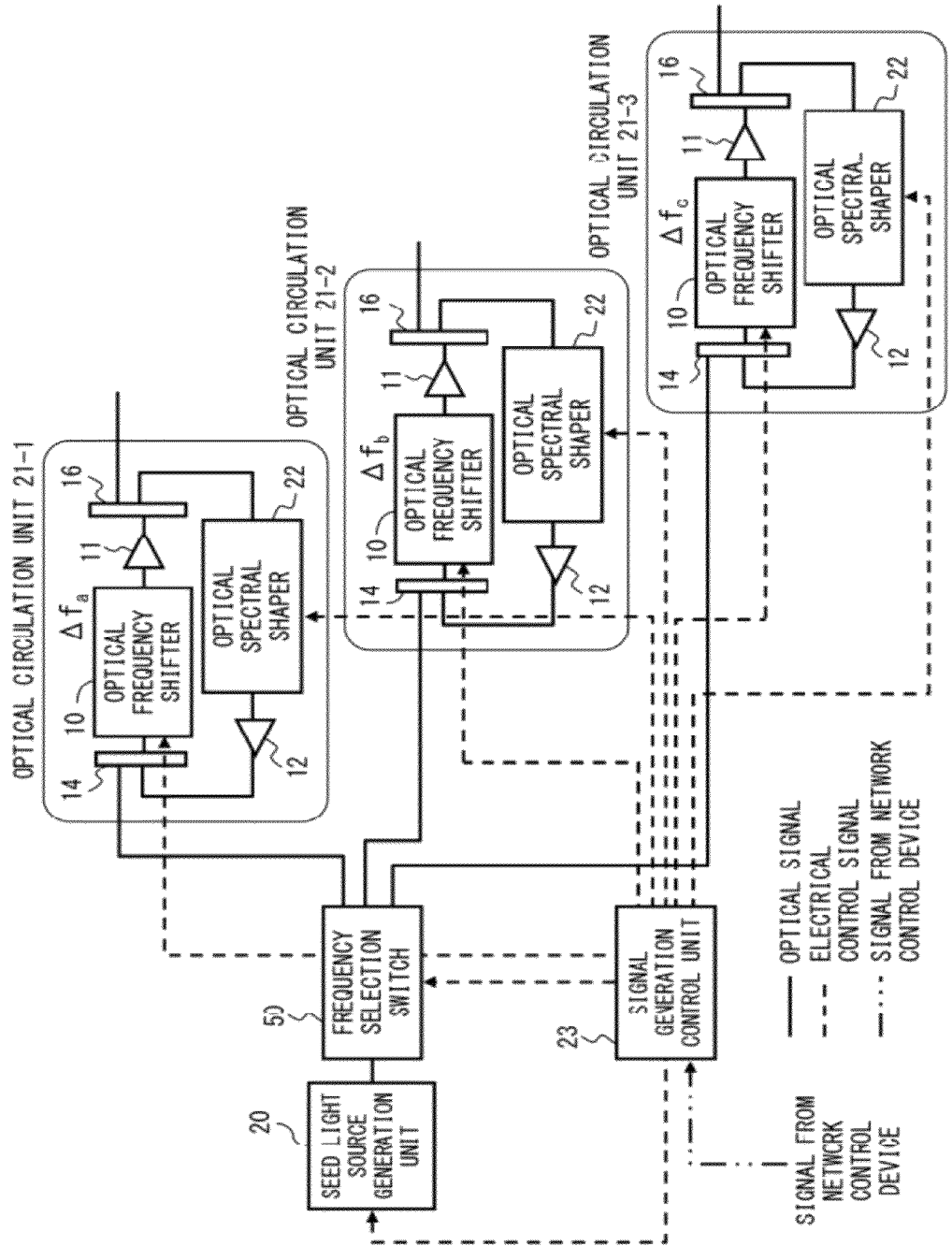
F I G. 17

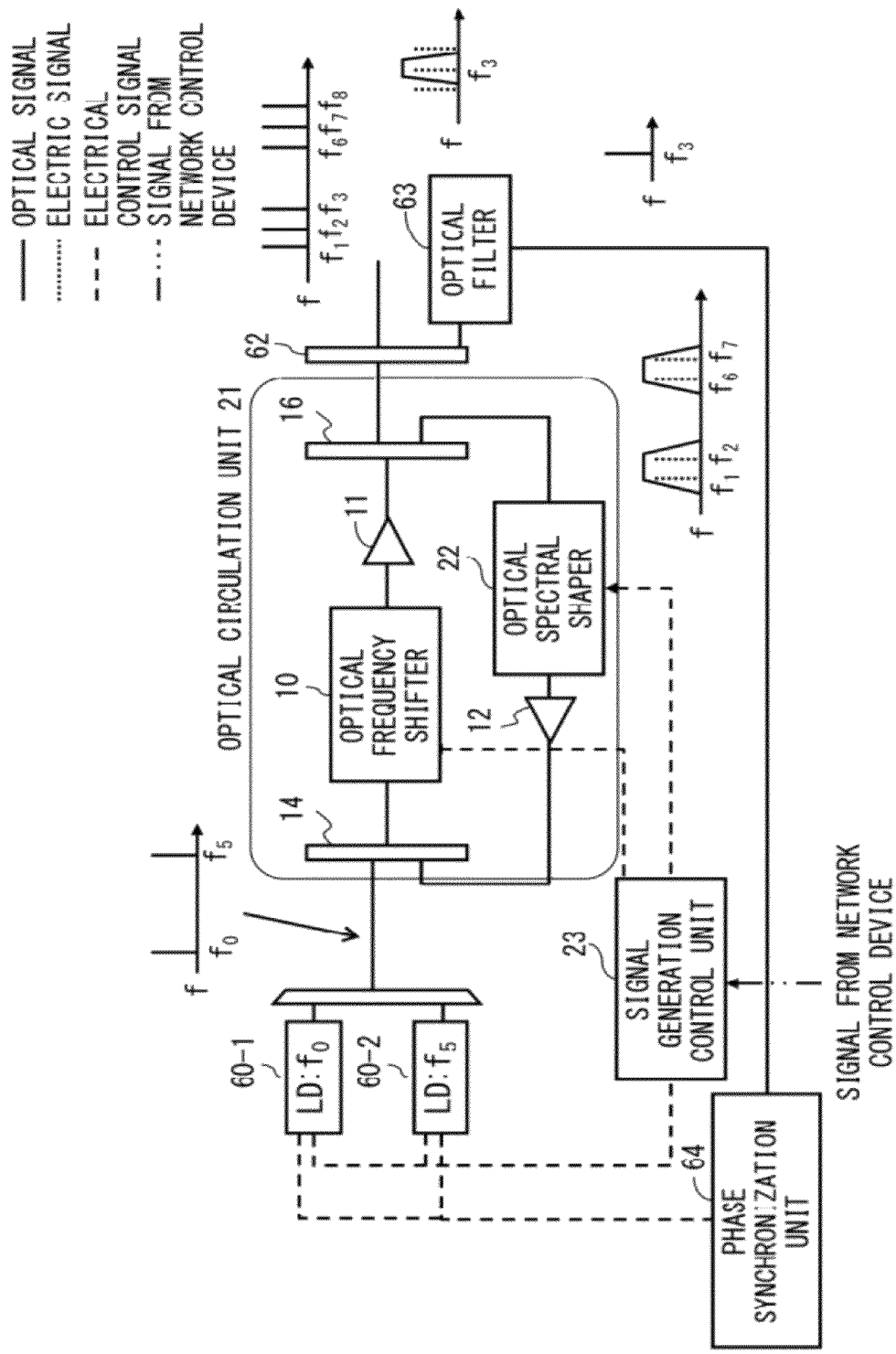
F I G. 19

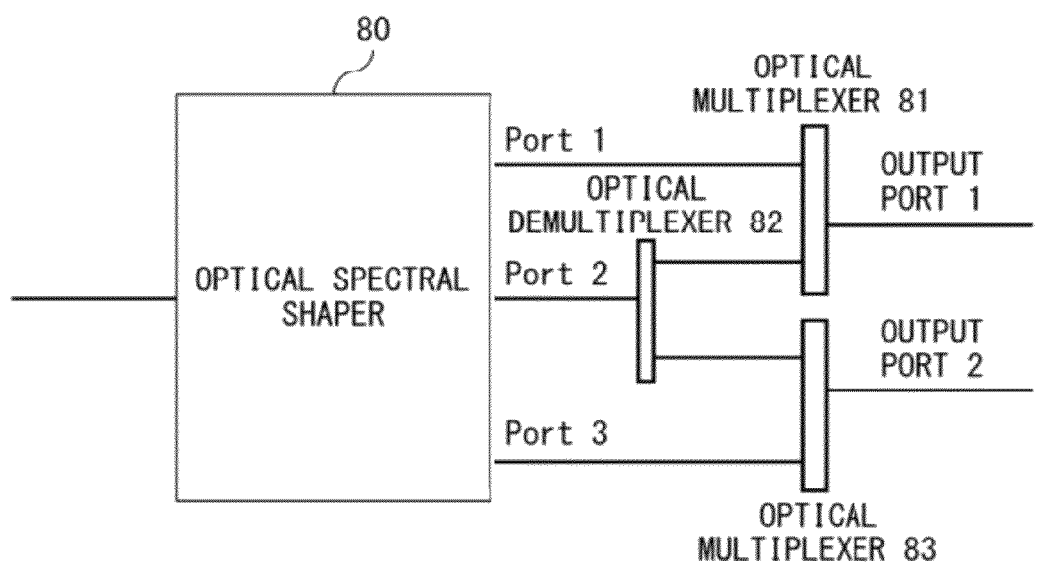
F I G. 23

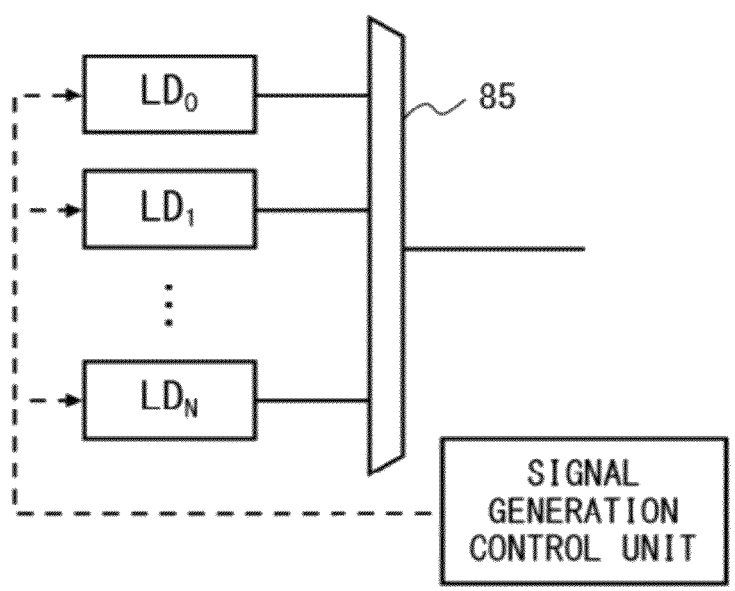
F I G. 2 4

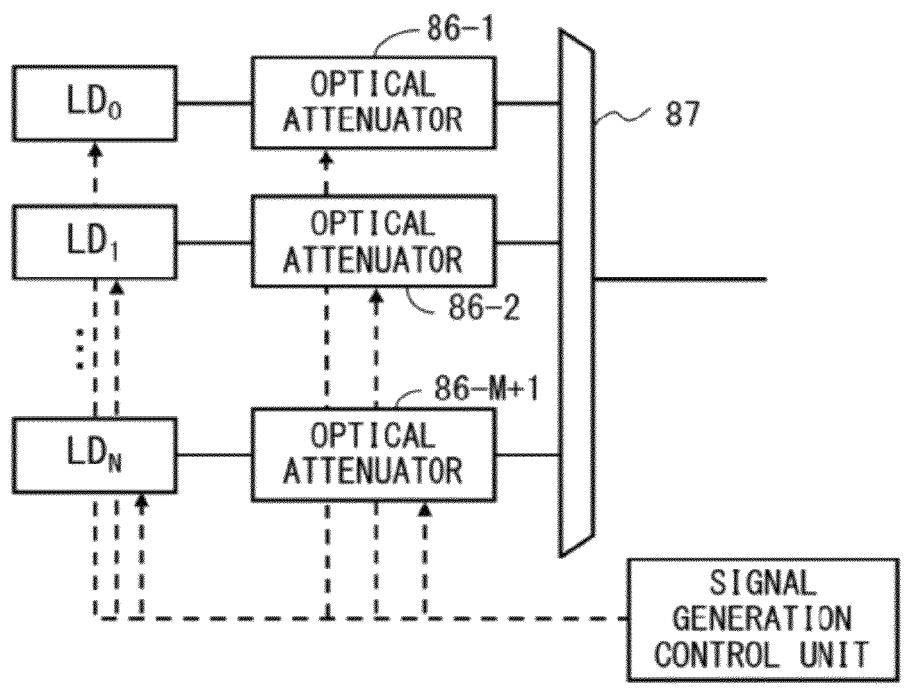
F I G. 2 5

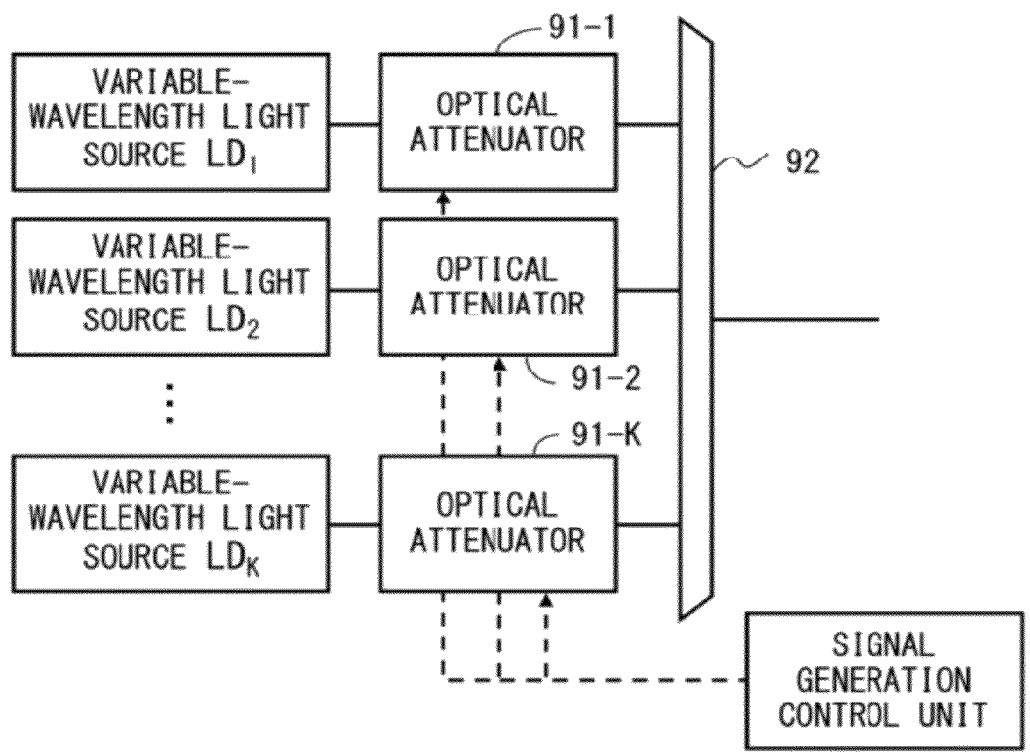
F I G. 27

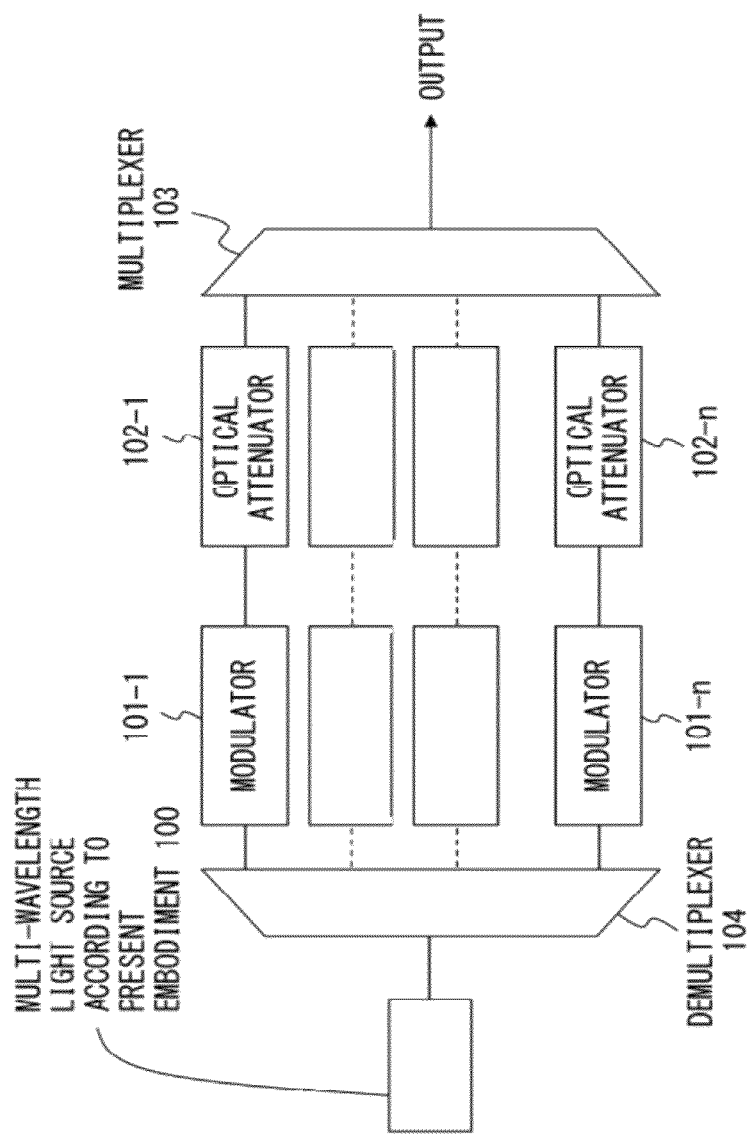
F I G. 29

MULTI-WAVELENGTH LIGHT SOURCE

CROSS-REFERENCE TO RELATED APPLICATION

This application is based upon and claims the benefit of priority of the prior Japanese Patent Application No. 2011-068869, filed on Mar. 25, 2011, the entire contents of which are incorporated herein by reference.

FIELD

The embodiments discussed herein are related to a multi-wavelength light source that generates an optical signal having a plurality of wavelengths.

BACKGROUND

As the widespread use of the Internet and mobile phones has increased communication capacities in recent years, backbone optical communication systems are required to have larger capacities, and research and development have been carried out for optical transmitter-receivers having a communication capacity of 40 Gbit/s, 100 Gbit/s, or higher for a single wavelength.

However, if a transmission capacity per single wavelength is increased, the quality of transmitted signals deteriorates greatly due to a lowered OSNR (Optical Signal to Noise Ratio), waveform distortions caused by wavelength dispersion on transmission paths, polarization mode dispersion, nonlinear effects, and the like.

Accordingly, digital coherent receiving schemes resistant to poor OSNR and also resistant to waveform distortions on transmission paths are gathering attention as schemes for optical communication systems yielding 40 Gbit/s or higher.

According to conventional receiving schemes, ON and OFF signals based on light intensities are assigned to binary signals to be used for direct detection (OOK: On-OFF Keying). By contrast, according to digital coherent receiving schemes, light intensity and phase information are extracted using a coherent receiving system, and the extracted light intensity and phase information are quantized using an analog/digital converter (ADC), and thereby demodulation is performed by a digital signal processing circuit.

Digital coherent receiving schemes are capable of improving the resistance to poor OSNR by using coherent receiving schemes, and are capable of compensating for waveform distortions by using a digital signal processing circuit, and accordingly are capable of suppressing deteriorations of quality of transmitted signals even when a communication capacity for one wavelength is large. Also, wavelength distortions may be compensated for by a digital signal processing circuit, which enables relatively flexible responses to transmission route modifications caused by network configuration modifications.

Further, digital coherent receiving schemes may be combined with modulation schemes capable of transmitting multi-bit information for one symbol so as to construct transmission systems yielding high-frequency efficiencies. As modulation schemes of this type, multivalued modulation schemes such as QPSK (quadri-phase shift keying), 8PSK, 16QAM, and 256QAM that multiply phase information and intensity information, a polarized multiplexing scheme that multiplexes different information onto orthogonal polarized waves, and a multi-carrier multiplexing scheme that multiplexes different information onto a plurality of frequencies that have been multiplexed highly densely within one wavelength grid (sub carriers), etc., are known. Among multi-carrier multiplexing schemes, OFDM (Orthogonal Frequency Division Multiplexing), in particular, is considered to be promising as a future optical communication method.

Generating an OFDM signal requires a plurality of beams of light whose frequencies have been synchronized. In addition, the frequency and the wavelength of light correspond to each other in a one-to-one manner, and they act as carriers, and accordingly, they are referred to as the frequency of light, the wavelength of light, or the carrier in the explanations below.

Further, it is desirable that the number of carriers of OFDM (i.e., the total bit rate per one OFDM signal) be variable in response to the traffic of a network.

FIGS. 1A and 1B illustrate an example of a conventional multi-wavelength light source.

In the multi-wavelength light source illustrated in FIG. 1A, continuous light with a center wavelength of $f_0$ is input, from a laser diode 15, to an optical circulation unit including an optical SSB (Single Side-Band) modulation device 10, optical amplifiers 11 and 12, an optical filter 13, an optical multiplexer (optical coupler) 14, and an optical demultiplexer (optical coupler) 16. Periodic waves with frequency $\Delta f$ as a drive signal and periodic waves that are phase-shifted by $\pi/2$ from the first periodic waves are input to the optical SSB modulator in the optical SSB modulation device 10.

Input light passes through the optical SSB modulation device 10, and thereby has its frequency shifted by $\Delta f$ to the higher side so that $f_1 = f_0 + \Delta f$. Part of the light is output (zero-circulation output in FIG. 1B), and part of the remaining light propagates in the optical circulation unit, passes through the optical filter 13 and the optical amplifier, and is again input to the optical SSB modulation device 10.

The continuous light with its center frequency $f_1$ passes through the optical SSB modulator in the optical SSB modulation device 10, and thereby has its center frequency shifted by $\Delta f$ to center frequency $f_2$. Similarly, part of the light is output (one-circulation output in FIG. 1B), and part of the remaining light propagates in the optical circulation unit. By repeating this, multi-wavelength continuous light having $f_1$ through $f_6$ may be obtained through five-circulation output. In the example in FIG. 1A, light having $f_2$ or higher will not be generated because the optical filter 13 in the optical circulation unit is set to have a transmission bandwidth that transmits from $f_1$ through $f_5$.

As has been described above, the optical SSB modulation device 10 shifts the frequencies of input continuous light, and thus the optical SSB modulation device 10 is also referred to as an optical frequency shifter. An optical frequency shifter is not limited to a device that uses an optical SSB modulator if the shifter is capable of shifting frequencies of input continuous light.

In a multi-wavelength light source including the optical SSB modulation device 10 and an optical circulation unit as described above, the OSNR (Optical Signal to Noise Ratio) of a wavelength with a large number of times of circulation deteriorates when such a wavelength light source generates a large number of wavelengths.

FIG. 2 explains OSNR deterioration.

FIG. 2 is a graph having the horizontal axis representing the number of generated carriers and the vertical axis representing the OSNR of each carrier to depict how the OSNR of each carrier changes in response to an increase in the number of generated carriers. When the number of generated carriers is one, the OSNR of the carrier is 50 dB or higher, while when the number of generated carriers has reached eight, the OSNR of each carrier drops to 40 dB. Further, when the number of generated carriers increases to nine or ten, the OSNR of each carrier drops further.

FIG. 3 illustrates a configuration that has conventionally been required when a plurality of wavelengths are to be used for communication.

As illustrated also in FIG. 2, a single conventional multi-wavelength light source is capable of generating at most about eight wavelengths due to the OSNR of each carrier. Accordingly, as illustrated in FIG. 3, an optical communication system that multiplexes several tens of waves or several hundreds of waves needs to be provided with many multi-wavelength light sources such as those illustrated in FIG. 1A. However, this configuration increases the number of light sources and also increases the cost of the communication system.

Also, as conventional techniques, there are a fiber-ring-resonator-type light source that oscillates multi wavelengths simultaneously, a wavelength management device for securing wavelength stability of a multi-wavelength light source, a multi-wavelength light source that is capable of simultaneously providing a multi-wavelength continuous light having constant intervals, and the like.

Patent Document 1: Japanese Laid-open Patent Publication No. 10-93164
Patent Document 2: Japanese Laid-open Patent Publication No. 2000-47278
Patent Document 3: Japanese Laid-open Patent Publication No. 2005-77584

SUMMARY

A multi-wavelength light source according to an aspect of embodiments described below includes an optical frequency shifter to shift a frequency of input light by an amount of frequency shift that has been set, a seed light source generation unit to input light having a plurality of different frequencies to the optical frequency shifter, a circulation path to cause an output from the optical frequency shifter to circulate to an input side of the optical frequency shifter, an optical spectral shaper capable of setting an attenuation amount individually for light of each frequency output from the optical frequency shifter so as to transmit only light of a set frequency, and a controller to control a frequency output from the seed light source generation unit, output power of each beam of light output from the seed light source generation unit, the amount of frequency shift of the optical frequency shifter, and the attenuation amount by the optical spectral shaper on the basis of a number of carriers, a carrier arrangement, and a carrier frequency interval.

According to the embodiments below, a multi-wavelength light source capable of generating continuous light having many wavelengths while maintaining an OSNR is provided.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 1A and 1B illustrate an example of a conventional multi-wavelength light source;
FIG. 12 illustrates the second configuration example (second part) according to the present embodiment;
FIG. 17 illustrates a fifth configuration example according to the present embodiment;
FIG. 19 illustrates a seventh configuration example according to the present embodiment;
FIG. 23 illustrates a tenth configuration example (second part) according to the present embodiment;
FIG. 24 illustrates a configuration example (first part) of a seed light source generation unit;
FIG. 25 illustrates a configuration example (second part) of the seed light source generation unit;
FIG. 27 illustrates a configuration example (fourth part) of the seed light source generation unit;
FIG. 29 illustrates an optical transmitter using a multi-wavelength light source according to the present embodiment.

DESCRIPTION OF EMBODIMENTS

Figure 2:
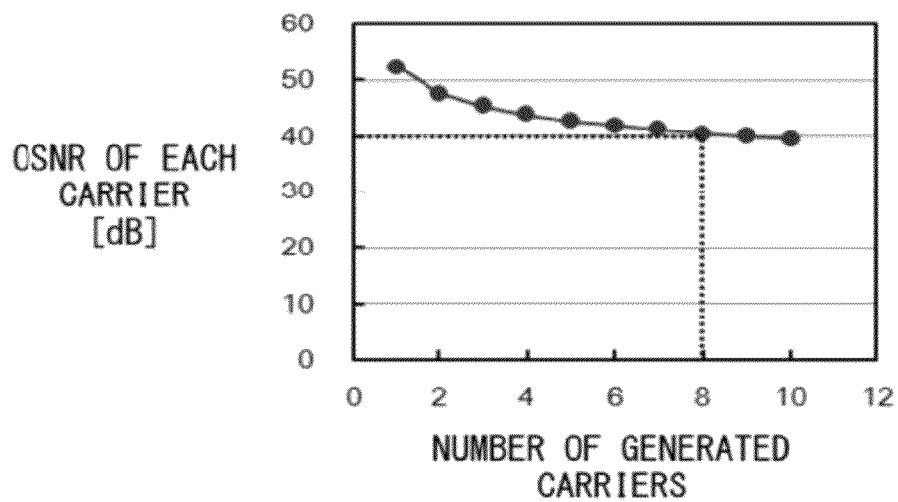
FIG. 2 explains OSNR deterioration.
Figure 3:
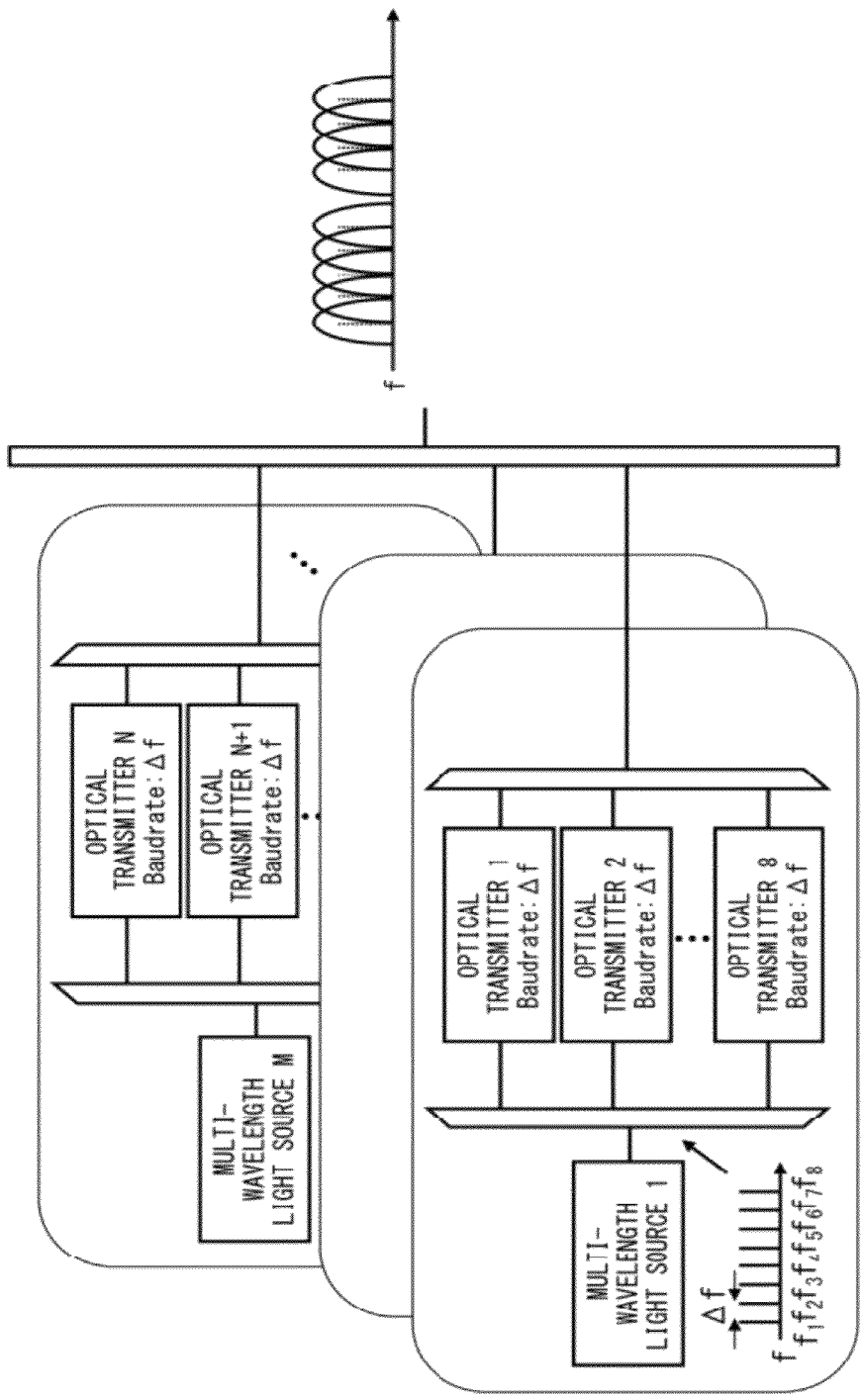
FIG. 3 illustrates a configuration that has conventionally been required to use a lot of wavelengths for communication.
Figure 4:
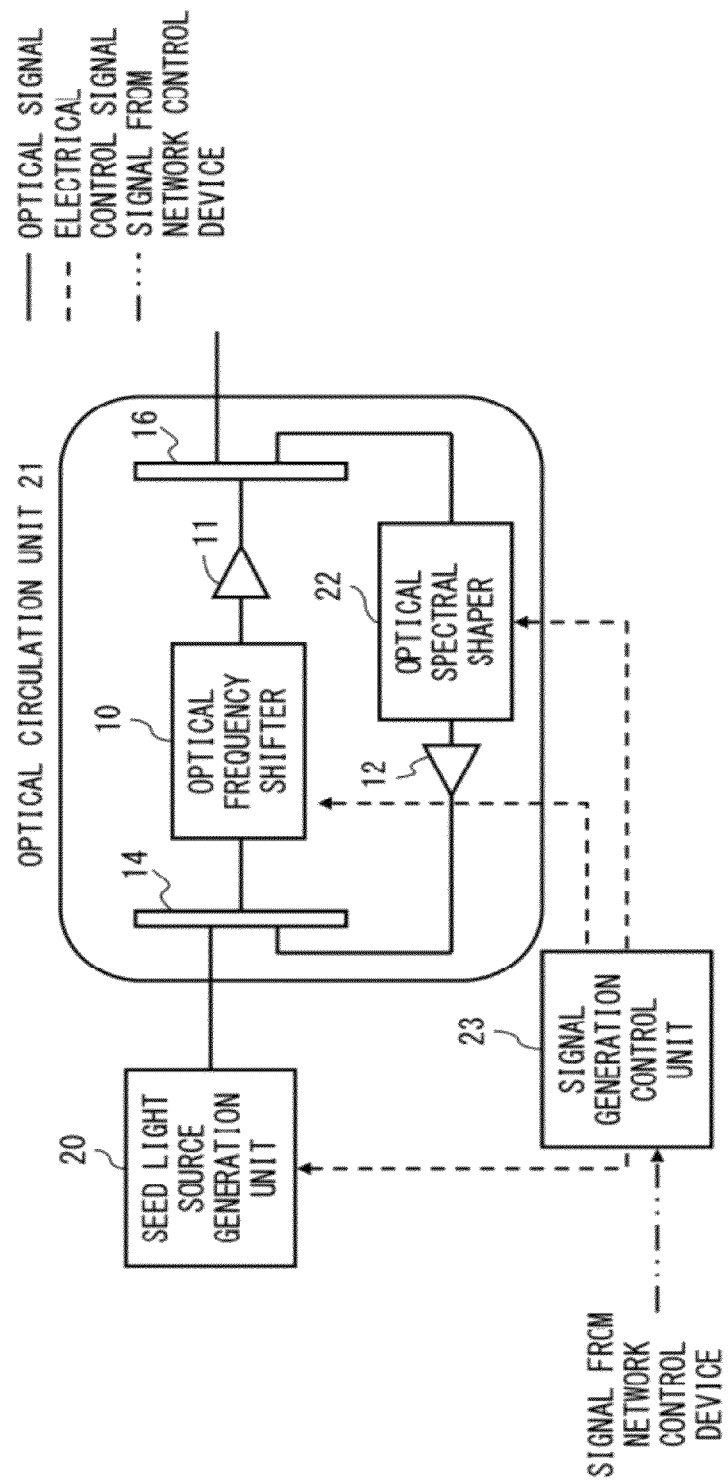
FIG. 4 illustrates a configuration of the present embodiment.

FIG. 4 illustrates a configuration of the present embodiment.

In FIG. 4, constituents similar to those in FIG. 1A are denoted by the same numerical symbols, and explanations thereof will be omitted.

A multi-wavelength light source according to the present embodiment includes a seed light source generation unit 20 for outputting continuous light having a single wavelength (frequency) or outputting a plurality of beams of continuous light having different wavelengths (frequencies), an optical circulation unit 21 for generating a continuous light having a plurality of frequencies, an optical spectral shaper 22 that is provided in the optical circulation unit 21 and is capable of setting the amount of optical attenuation for each frequency unit, and a signal generation controller 23 for controlling the frequency of light generated by the seed light source generation unit 20, the amount of frequency shifted by the optical frequency shifter 10, and the transmission frequency and the amount to be attenuated by the optical spectral shaper 22 in response to the number of carriers, the carrier frequency arrangement, and the carrier frequency interval requested by the network control device.

The above configuration makes it possible to configure a multi-wavelength light source capable of changing the number of carriers, the carrier arrangement, and the carrier interval while maintaining a desired OSNR, and is also capable of reducing the number of required multi-wavelength light sources, as will be described later.

Figure 5:
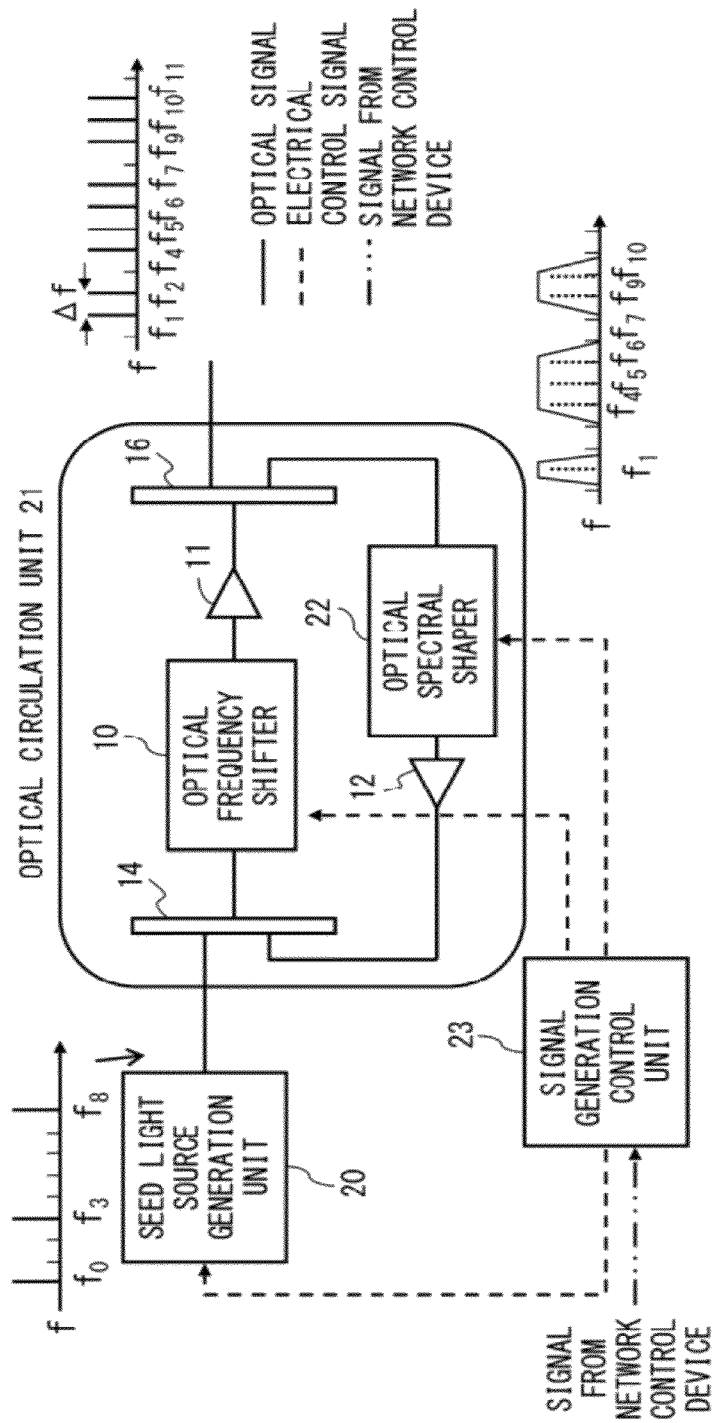
FIG. 5 illustrates operations of the multi-wavelength light source illustrated in FIG. 4.

FIG. 5 illustrates operations of the multi-wavelength light source illustrated in FIG. 4. In FIG. 5, constituents similar to those in FIG. 4 are denoted by the same numerical symbols as those in FIG. 4. Light having optical frequencies $f_0$, $f_3$ and $f_8$ are output from the seed light source generation unit 20. Continuous light output from this seed light source generation unit 20 is referred to as seed light. The optical spectral shaper 22 is set to transmit $f_1$, $f_4$ through $f_6$, $f_9$, and $f_{10}$, and thereby multi-wavelength light having optical frequencies $f_1$, $f_2$, $f_4$ through $f_7$, and $f_9$ through $f_{11}$ can be obtained. In other words, the optical spectral shaper 22 transmits only optical frequencies $f_1$, $f_4$ through $f_6$, $f_9$, and $f_{10}$. The continuous light having optical frequency $f_0$ is optical-frequency shifted to continuous light having optical frequency $f_1$, and this light is further optical-frequency shifted to continuous light having optical frequency $f_2$. The optical spectral shaper 22 does not transmit optical frequency $f_2$, and thus optical frequency $f_3$ is not output. Similarly, from continuous light having optical frequency $f_3$ output from the seed light source generation unit 20, continuous light having optical frequencies $f_4$ through $f_7$ is generated. Optical frequency $f_8$ is not output because the optical spectral shaper 22 does not transmit the continuous light having optical frequency $f_7$. From the continuous light having optical frequency $f_8$ output from the seed light source generation unit 20, continuous light having optical frequencies $f_9$ through $f_{11}$ is generated. Because the optical spectral shaper 22 does not transmit the continuous light having optical.

According to the above configuration, continuous light having many optical frequencies is generated from seed light having a plurality of optical frequencies output from the seed light source generation unit 20, and continuous light having fewer optical frequencies that have been shifted is generated from seed light having one optical frequency. Accordingly, it is possible to avoid the deterioration of the OSNR of continuous light having a large number of times of circulation through the optical circulation unit 21 caused by generating continuous light having many frequencies shifted from continuous light having one optical frequency.

Also, because the seed light source generation unit alone outputs continuous light having a plurality of different optical frequencies, the necessity of preparing many light sources for generating continuous light having many optical frequencies is eliminated.

In addition, although the configuration of the modulating unit for shifting optical frequencies to the higher side has been used as the optical frequency shifter 10 in the above example, the optical frequency shifter 10 may be configured to shift optical frequencies to the lower side.

When optical frequencies are to be shifted to the higher side, the seed light source generation unit 20 generates continuous light having a frequency obtained by subtracting the frequency shifting amount from the lowest frequency among carriers to be generated. When optical frequencies are to be shifted to the lower side, the seed light source generation unit 20 generates continuous light having a frequency obtained by adding the frequency shifting amount to the highest frequency among the carriers.

The optical spectral shaper 22 may be configured by a "1:N"-optical-wavelength-selection switch, a wavelength processor, and the like (N is an integer equal to or greater than one, and optical wavelength selection switches with N being around nine have currently been commercially available). For information about an optical wavelength selection switch that is capable of outputting, to arbitrary ports, input light (multi-wavelength light), please refer to the document below. G. Baxter, et al., "Highly programmable Wavelength Selective Switch based on Liquid Crystal on Silicon switching elements," OFC2006, OTuF2, 2006

Also, for information about wavelength processors, please refer to the document below.

Y. Sakurai, et al., "LCOS-Based 4×4 Wavelength Cross-Connect Switch For Flexible Channel Management in ROADMs," OFC2011, OTuM4, 2011

Also, for information about optical shifters/optical SSB modulators, please refer to the documents below.

M. Izutsu, S. Shikama, and T. Sueta, "Integrated optical SSB modulator/frequency shifter," *IEEE J. Quantum Electron.*, vol. QE-17, pp. 2225-2227, November 1981

B. Desormiere, C. Maerfeld, and J. Desbois, "An integrated optic frequency translator for microwave lightwave systems," *J. Lightwave Technol.*, vol. 8, pp. 506-513, April 1990.

K. Shibuya, S. Hisatake, and T. Kobayashi, "10-GHz-Order High-Efficiency Electrooptic Frequency Shifter Using Slant-Periodic Domain Inversion," *Photon. Technol. Lett*, vol. 16, pp. 1939-1941, August 2004.

FIGS. 6 through 9 are flowcharts explaining control processing performed in the present embodiment.

Figure 6:
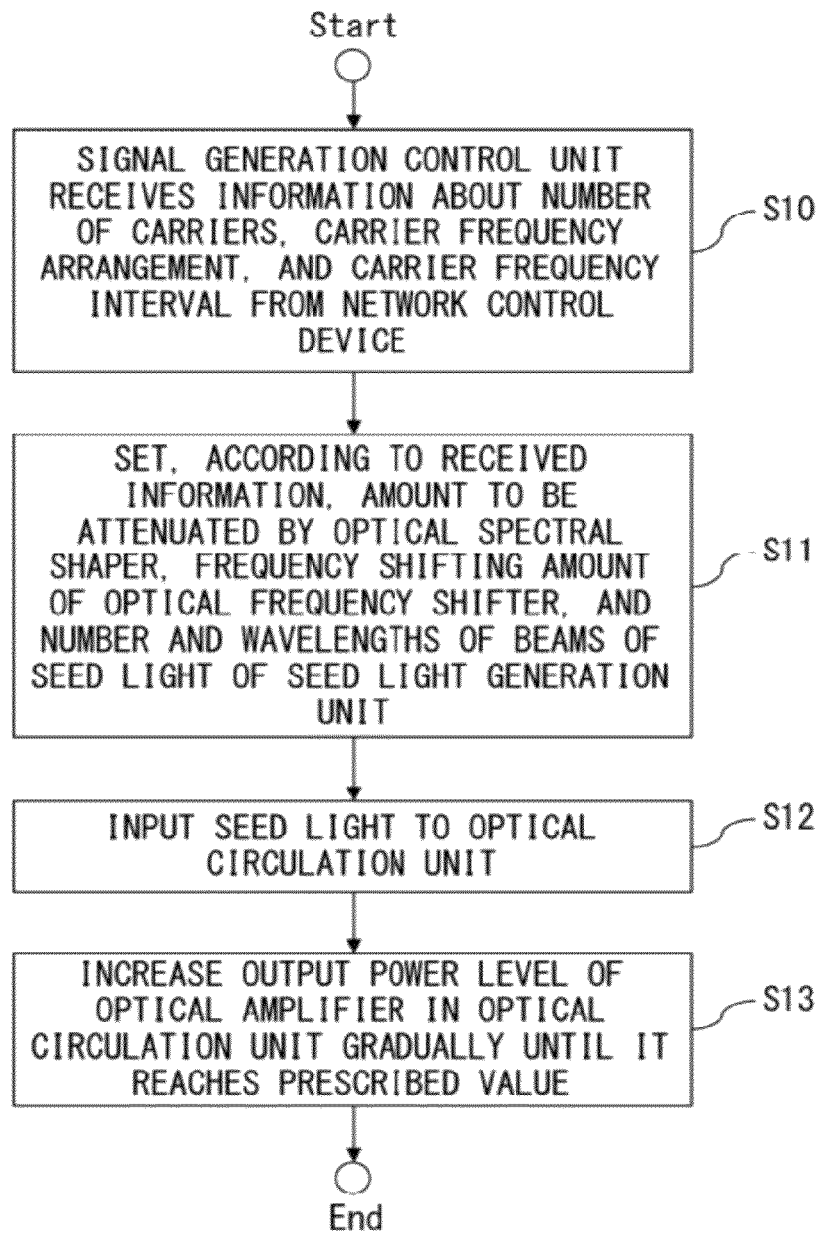
FIG. 6 is a flowchart (first part) explaining a control process according to the present embodiment.

FIG. 6 is a control flowchart used when the output level of the optical amplifier is to be raised gradually.

First, in step S10, a signal generation controller receives information about the number of carriers, the carrier frequency arrangement, and the carrier frequency interval from a network control device (not illustrated). In step S11, the signal generation controller sets, according to the received information, the amount to be attenuated by the optical spectral shaper, the frequency shifting amount of the optical frequency shifter, and the number and the wavelengths of beams of seed light of the seed light generation unit, and the like. In step S12, the seed light is input to the optical circulation unit, and in step S13, the output level of the optical amplifier in the optical circulation unit is increased gradually until it reaches a prescribed output value. The reason for gradually increasing the output level of the optical amplifier in step S13 is that a sudden output of highly intensive continuous light causes a highly intensive surge in a subsequent-stage device that is connected to the multi-wavelength light source of the present embodiment, which may lead to failure in the device.

In step S12, according to the present embodiment, the number of beams of seed light generated by the seed light source generation unit is equal to the number of carrier groups. "Carrier group" used in the present embodiment is a group of carriers. Among carriers to be generated, carriers having adjacent frequencies are treated as one group when the carrier frequency intervals on the higher and lower sides are two scales or greater on an optical frequency grid having the horizontal axis representing frequency f and the intervals on the axis representing Δf. However, when carriers include the lowest frequency carrier and they are apart by two or more carrier frequency intervals at only the higher side, they are treated as a group. Also, when carriers include the highest frequency carrier and they are apart by two or more carrier frequency intervals at only the lower side, they are treated as a single group.

When the optical frequency shifter shifts an optical frequency to the higher side by $\Delta f_{high}$, the optical frequency obtained by subtracting $\Delta f_{high}$ from the lowest carrier frequency in each carrier group is employed as the frequency of the seed light of that carrier group. Also, an optical spectral shaper is set to not transmit the highest frequencies in respective carrier groups, but is set to transmit all carrier frequencies to be generated except for those highest frequencies.

When the optical frequency shifter shifts an optical frequency to the lower side by $\Delta f_{low}$, the optical frequency obtained by adding $\Delta f_{low}$ to the highest carrier frequency in each carrier group is employed as the frequency of the seed light of that carrier group. Also, an optical spectral shaper is set to not transmit the lowest frequencies in respective carrier groups, but is set to transmit all carrier frequencies to be generated except for those lowest frequencies.

Figure 7:
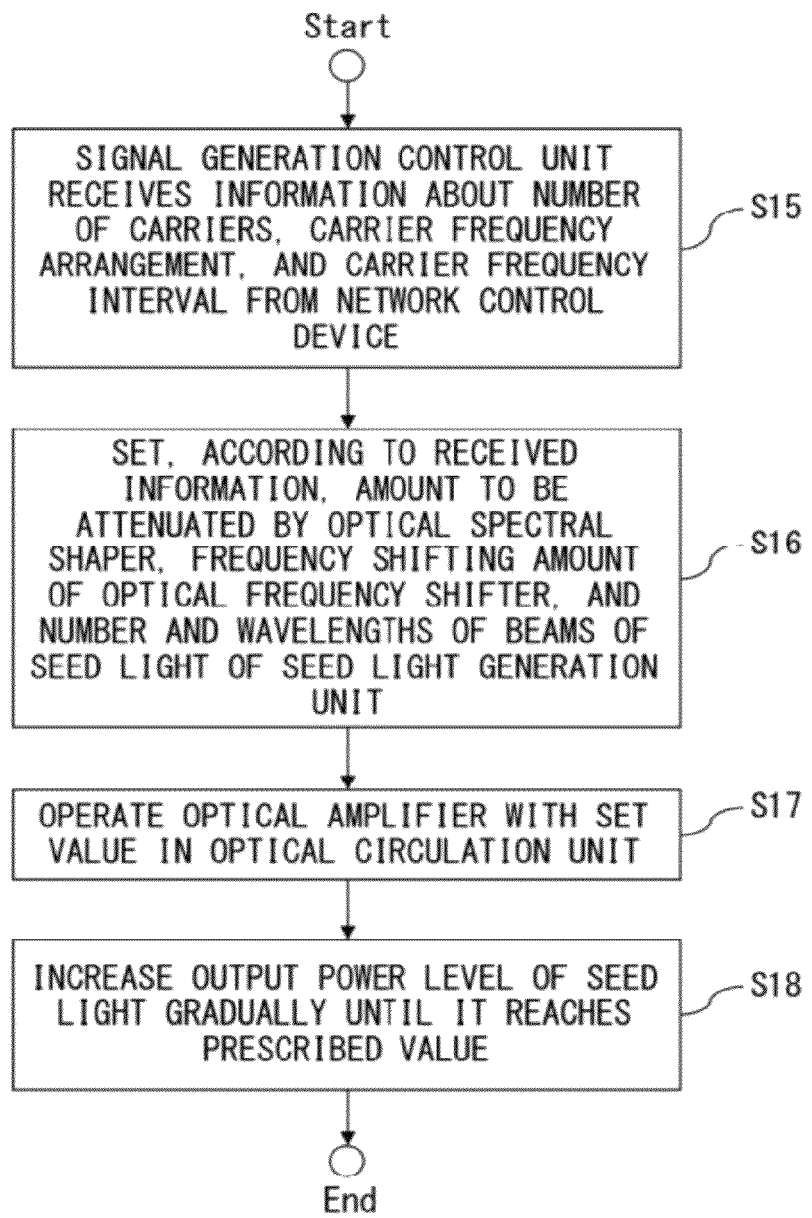
FIG. 7 is a flowchart (second part) explaining a control process according to the present embodiment.

FIG. 7 is a flowchart for gradually increasing the output power of the seed light.

In step S15, the signal generation controller receives, from a network control device (not illustrated), information about the number of carriers, the carrier frequency arrangement, and the carrier frequency interval. In step S16, the signal generation controller sets, according to the received information, the amount to be attenuated by the optical spectral shaper, the frequency shifting amount by the optical frequency shifter, and the number and the wavelengths of beams of seed light of the seed light source generation unit. In step S17, the optical amplifier in the optical circulation unit is operated with a setting value gain that has been set in advance. In step S18, the output power of the seed light is increased gradually until it reaches the setting value that has been set in advance. At this moment too, the output power of the seed light is increased gradually so that a surge will not be caused in a subsequent-stage device of the multi-wavelength light source of the present invention.

Figure 8:
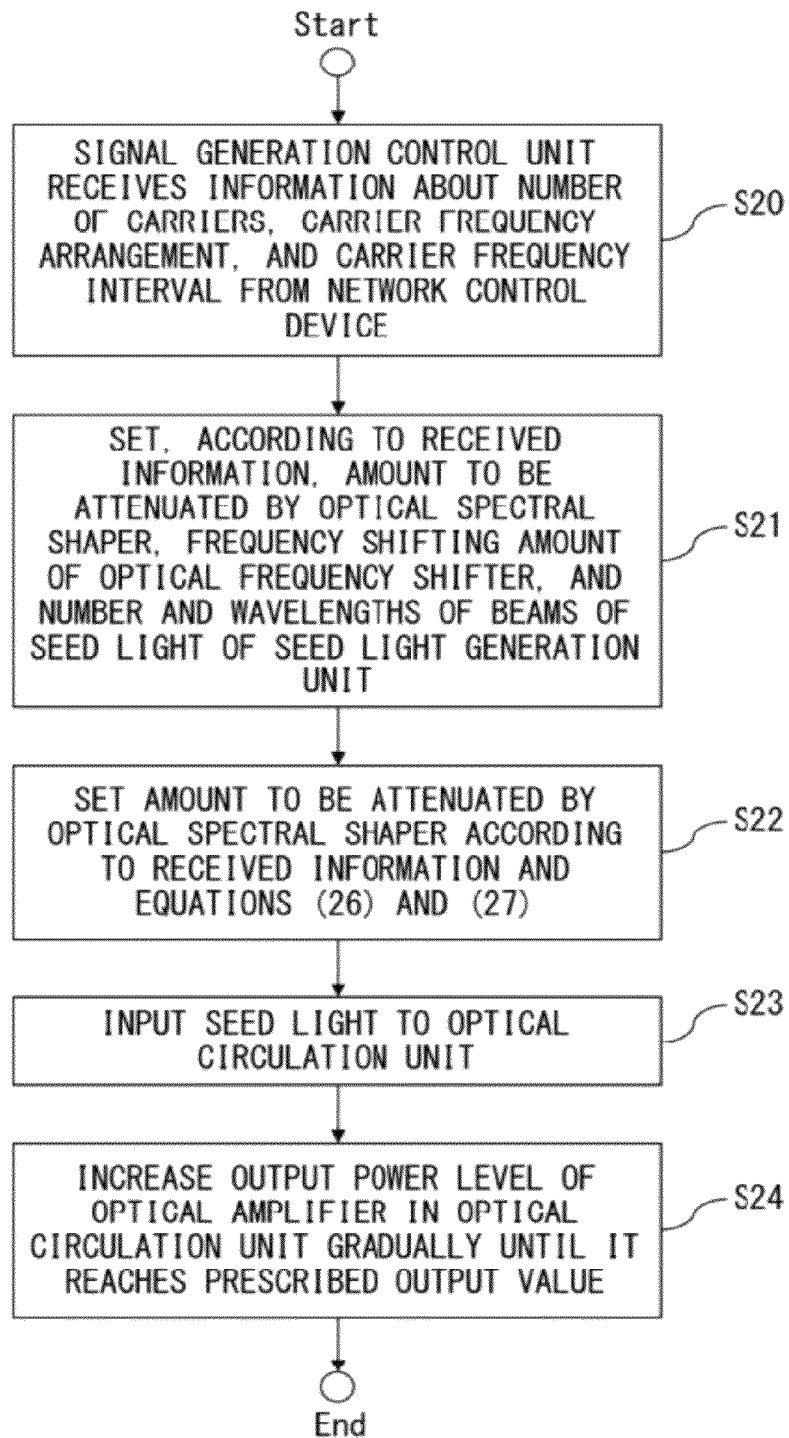
FIG. 8 is a flowchart (third part) explaining a control process according to the present embodiment.

FIG. 8 is another flowchart for gradually increasing the output power of the optical amplifier.

In step S20, the signal generation controller receives, from a network control device (not illustrated), information about the number of carriers, the carrier frequency arrangement, and the carrier frequency interval. In step S21, the signal generation controller sets, according to the received information, the frequency shifting amount by the optical frequency shifter, and the number and the wavelengths of beams of seed light of the seed light source generation unit. In step S22, the signal generation controller sets the amount to be attenuated by the optical spectral shaper according to the received information and equations (26) and (27) described later. In step S23, the seed light is input to the optical circulation unit, and in step S24, the output level of the optical amplifier in the optical circulation unit is gradually increased until it reaches a prescribed output value. At this moment too, the output power of the seed light is increased gradually so that a surge will not be caused in a subsequent-stage device.

In step S22, in addition to the setting of transmission bandwidth in the optical spectral shaper, the amount to be attenuated by the optical spectral shaper is set in such a manner that equations (26) and (27) described later are satisfied, and thereby the output power may be made consistent.

Figure 9:
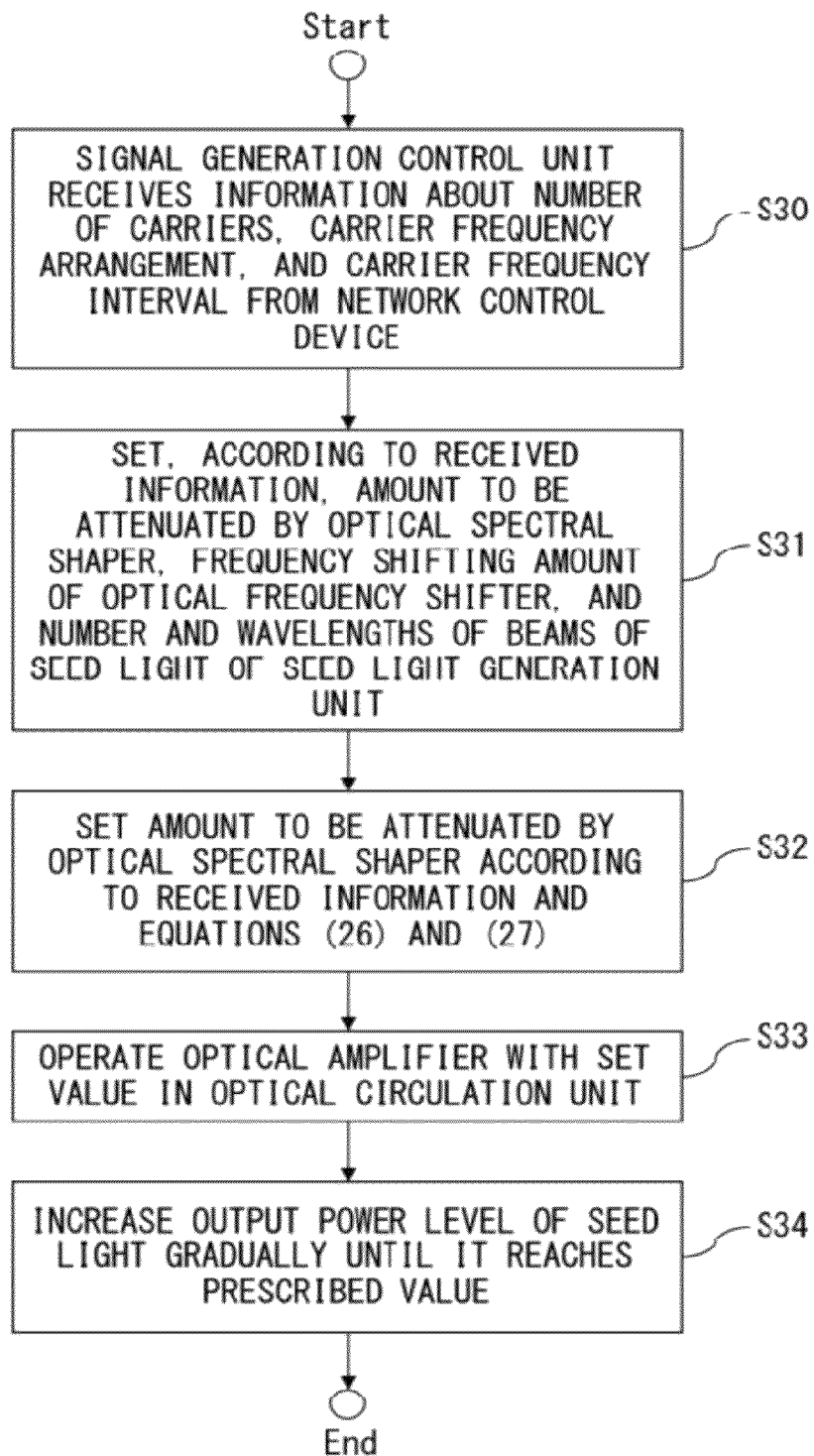
FIG. 9 is a flowchart (fourth part) explaining a control process according to the present embodiment.

FIG. 9 is still another flowchart for gradually increasing the output power of the seed light.

In step S30, the signal generation controller receives, from a network control device (not illustrated), information about the number of carriers, the carrier frequency arrangement, and the carrier frequency interval. In step S31, the signal generation controller sets, according to the received information, the frequency shifting amount by the optical frequency shifter, and the number and the wavelengths of beams of seed light of the seed light source generation unit. In step S32, the signal generation controller sets the amount to be attenuated by the optical spectral shaper according to the received information and equations (26) and (27) described later. In step S33, the optical amplifier in the optical circulation unit is operated with a setting value. In step S34, the output power of the seed light is increased gradually until it reaches the setting value that has been set in advance. At this moment too, the output power of the seed light is increased gradually so that a surge will not be caused in a subsequent-stage device.

Figure 10:
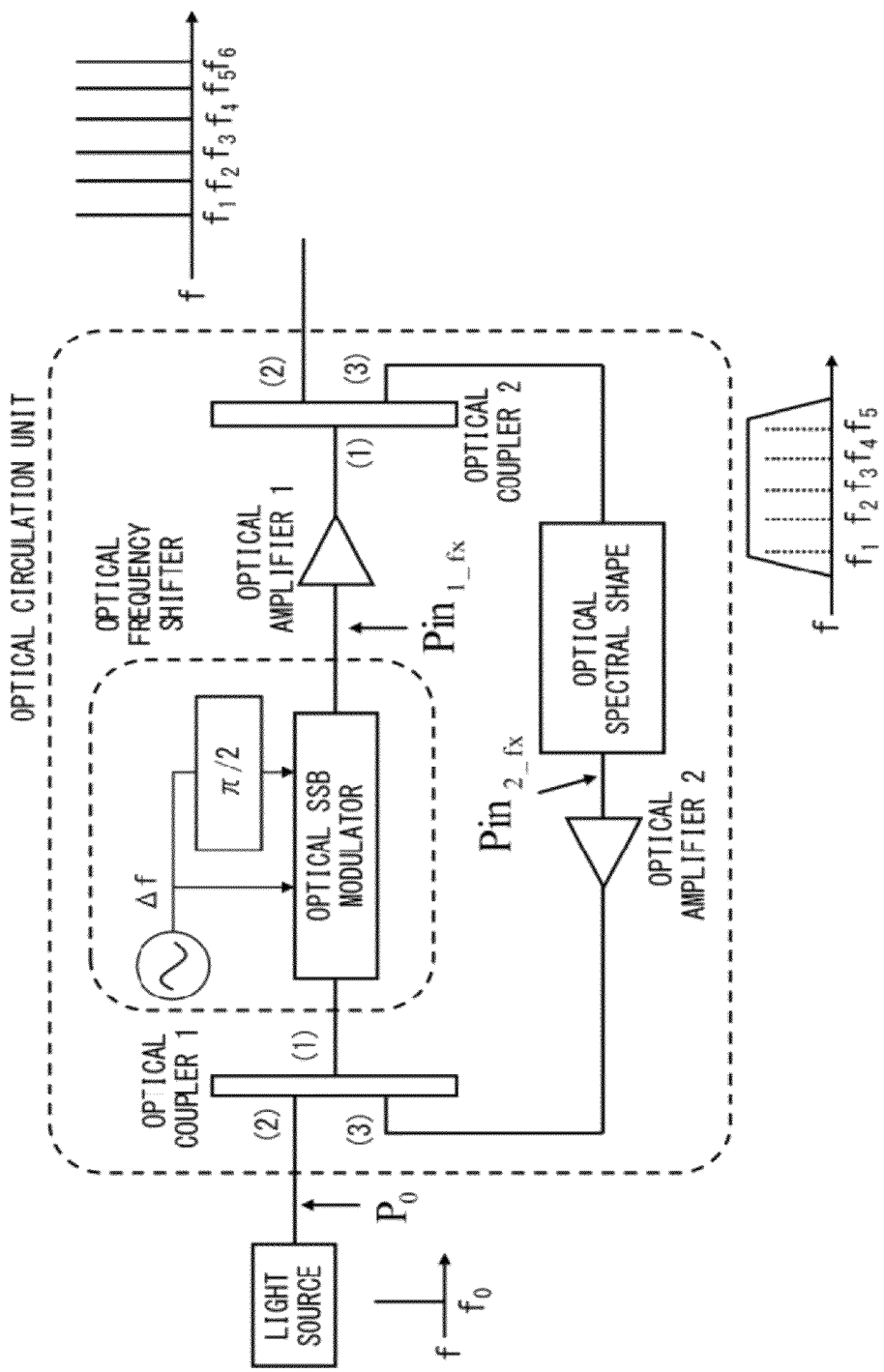
FIG. 10 explains derivation of the output-terminal OSNR and the output power of a multi-wavelength light source according to the present embodiment.

FIG. 10 explains a derivation of the output-terminal OSNR and the output power of a multi-wavelength light source according to the present embodiment.

In this example, equations (26) and (27) in FIGS. 8 and 9 are derived. FIG. 10 illustrates the light intensity of what portion, and the losses of optical couplers of what portions in the multi-wavelength light source are represented by $Pin_{1\_fx}$, $Pin_{2\_fx}$, and $P_0$.

Seed light having optical frequency $f_0$ and the optical power of $P_0$ is input to the optical circulation unit. An ideal optical frequency shifter is assumed. In this example, it is assumed that the optical frequency shifter shifts the frequency of input light by Δf to the higher side. According to this assumption, the OSNR (FinalOSNR$_1$) and the output power $P_{f1}$ of the optical signal having frequency $f_1$ ($=f_0+\Delta f$) that has passed the optical frequency shifter once are given by the following equations.

$$FinalOSNR_1 = OSNR_{LOOP1} = P_0\alpha_1/(NF(f_1)_1 hf_1\Delta f) \quad (1)$$

$$P_{f1} = P_0\alpha_1 G(f_1)\alpha_2 \quad (2)$$

Next, the OSNR and the output power of $P_{f2}$ of the optical signal having frequency $f_2$ ($=f_1+\Delta f$) that has circulated once and has passed the optical frequency shifter (optical SSB modulator) twice are given by the following equations.

$$FinalOSNR_2 = (OSNR_{LOOP1}^{-1} + OSNR_{LOOP2}^{-1})^{-1} \quad (3)$$

$$P_{f2} = P_0\alpha_1 G(f_1)_1 \alpha_3 ATT_{f1} G(f_1)_2 \alpha_4 G(f_2)_1 \alpha_2 \quad (4)$$

In the above equation, $OSNR_{LOOP1}$ is expressed by the equation below.

$$OSNR_{LOOP1} = ((Pin_{1\_f2}/(NF(f_2)_1 hf_2\Delta f))^{-1} + (Pin_{2\_f1}(NF(f_1)_2 hf_1\Delta f))^{-1})^{-1} \quad (5)$$

In the above equations:

$$Pin_{2\_f1} = P_0\alpha_1 G(f_1)_1\alpha_3 ATT_{f1} G \quad (6):$$

the input power of light having frequency $f_t$ to be input to the optical amplifier 2

$$Pin_{1\_f2} = P_0\alpha_1 G(f_1)_1\alpha_3 ATT_{f1} G(f_t)_2\alpha_4 \quad (7):$$

the input power of light having frequency $f_2$ to be input to the optical amplifier 1

$NF(f)_k$: the noise factor of optical amplifier k at frequency f h: Planck constant $\Delta f$: measured bandwidth $G(f_j)_k$: gain of optical amplifier k at frequency $f_j$ $ATT_{fj}$: amount to be attenuated by the optical spectral shaper at frequency $f_j$ $\alpha_1$: loss at the optical coupler 1 (direction (2)→(1) in FIG. 10)+optical SSB modulator insertion loss+modulation loss $\alpha_2$: loss at the optical coupler 2 (direction (1)→(2) in FIG. 10)

$\alpha_3$: loss at the optical coupler 2 (direction (1)→(3) in FIG. 10)

$\alpha_4$: loss at the optical coupler 1 (direction (3)→(1) in FIG. 10)+optical SSB modulator insertion loss+modulation loss Accordingly, the OSNR of an optical signal having optical frequency $f_1$ and the OSNR of an optical signal having optical frequencies $f_2$, $f_3$, . . . and their output power levels are as follows:

/Optical frequency $f_1$/

$$\text{FinalOSNR}_1 = \text{OSNR}_{LOOP1} = P_0 \alpha_1 / (NF(f_1)_1 h f_1 \Delta f) \tag{8}$$

$$P_{f1} = P_0 \alpha_1 G(f_1)_1 \alpha_2 \tag{9}$$

/Optical frequencies $f_2$, $f_3$, $f_4$, . . . /

[Equation 1]

$$\text{FinalOSNR}_j = \left( \text{OSNR}_{LOOP1}^{-1} + \sum_{k=2}^{j-1} (\text{OSNR}_{LOOPk})^{-1} \right)^{-1} \tag{10}$$

$j = 2, 3, 4 \ldots$ $$P_{fj} = G(f_j)_1 \alpha_2 P_0 \alpha_1 \alpha_3^{j-1} \alpha_4^{j-1} \prod_{i=1}^{j-1} G(f_i)_1 ATT_{fi} G(f_i)_2 \tag{11}$$

$j = 2, 3, 4 \ldots$

In addition, the parameters for the above equations are as below:

[Equation 2]

$$\text{OSNR}_{LOOPk} = \left( \left( \frac{\text{Pin}_{1\_fk}}{NF(f_k)_1 h f_k \Delta f} \right)^{-1} + \left( \frac{\text{Pin}_{2\_f(k-1)}}{NF(f_{k-1})_2 h f_{k-1} \Delta f} \right)^{-1} \right)^{-1} \tag{12}$$

$k = 2, 3, 4 \ldots$ $$\text{Pin}_{1\_fl} = P_0 \alpha_3^{l-1} \alpha_4^{l-1} \prod_{i=1}^{l-1} G(f_i)_1 ATT_{fi} G(f_i)_2 \tag{13}$$

$l = 2, 3, 4 \ldots$ $$\text{Pin}_{2\_fl} = P_0 \alpha_1 G(f_1)_1 \alpha_3 ATT_{fl} \tag{14}$$

$$\text{Pin}_{2\_fm} = P_0 \alpha_1 \alpha_3^m \alpha_4^{m-1} G(f_1)_1 ATT_{fl} \prod_{n=1}^{m-1} G(f_n)_2 ATT_{f(n+1)} G(f_{(n+1)})_1 \tag{15}$$

$m = 2, 3, 4 \ldots$

Power of zero-circulation light input to optical amplifier 1:

$$\text{Pin}_{1\_f1} = P_0 \alpha_1 \tag{16}$$

Power of one-circulation light input to optical amplifier 2:

$$\text{Pin}_{2\_f1} = P_0 \alpha_1 G(f_1)_1 \alpha_3 ATT_{f1} \tag{17}$$

Power of one-circulation light input to optical amplifier 1:

$$\text{Pin}_{1\_f2} = P_0 \alpha_1 G(f_1)_1 \alpha_3 ATT_{f1} G \tag{18}$$

Power of two-circulation light input to optical amplifier 2:

$$\text{Pin}_{2\_f2} = P_0 \alpha_1 G(f_1)_1 \alpha_3 ATT_{f1} G(f_1)_2 \alpha_4 G(f_2) \alpha_2 ATT_{f2} \tag{19}$$

The power of light having center frequency $f_N$ input to the optical amplifier 1 is expressed by the equations below.

[Equation 3]

$$\text{Pin}_{1\_f1} = P_0 \alpha_1 \quad N = 1 \ldots \tag{20}$$

$$\text{Pin}_{1\_fN} = P_0 \alpha_1 \alpha_3^{N-1} \alpha_4^{N-1} \prod_{i=1}^{N-1} G(f_i)_1 ATT_{fi} G(f_i)_2 \tag{21}$$

$N = 2, 3, 4 \ldots$

The input power of light having center frequency $f_N$ input to the optical amplifier 2 is expressed by the equations below.

[Equation 4]

$$\text{Pin}_{2\_f1} = P_0 \alpha_1 G(f_1)_1 \alpha_3 ATT_{f1} \quad N = 1 \ldots \tag{22}$$

$$\text{Pin}_{2\_fN} = P_0 \alpha_1 \alpha_3^N \alpha_4^{N-1} G(f_1)_1 ATT_{f1} \prod_{i=1}^{N-1} G(f_i)_2 ATT_{f(i+1)} G(f_{(i+1)})_1 \tag{23}$$

$N = 2, 3, 4 \ldots$

The output power of the light having center frequency $f_N$ output from the optical circulation unit is expressed by the equation below.

$$P_{fN} = G(f_N)_1 \alpha_2 \text{Pin}_{1\_fN} \quad N = 1, 2, 3 \tag{24}$$

The condition under which the output power of the light of each wavelength generated by the multi-wavelength light source is expressed by the equation below on the basis of equations (9) and (11).

[Equation 5]

$$G(f_1)_1 = G(f_j)_1 \alpha_3^{j-1} \alpha_4^{j-1} \prod_{i=1}^{j-1} G(f_i)_1 ATT_{fi} G(f_i)_2 \tag{25}$$

$j = 2, 3, 4 \ldots$

Equation (25) may be expressed as below.

[Equation 6]

$$\begin{cases} G(f_2)_1 \alpha_3 \alpha_4 ATT_{f1} G(f_1)_2 = 1 & j = 2 \quad (26) \\ G(f_j)_1 \alpha_3^{j-1} \alpha_4^{j-1} ATT_{f1} G(f_1)_2 \prod_{i=1}^{j-2} G(f_{i+1})_1 ATT_{f(i+1)} G(f_{i+1})_2 = 1 & j = 3, 4 \ldots \quad (27) \end{cases}$$

The values of $P_0$, $G(f_x)$, and $ATT_{fx}$ are obtained in such a manner that equations (26) and (27) above are satisfied, and the output power of the seed light generation unit, the gain of the optical amplifier, and the amount to be attenuated by the optical spectral shaper are controlled on the basis of those obtained values, and thereby seed light having multi wavelengths with output power levels consistent across a plurality of frequencies may be obtained.

Figure 11:
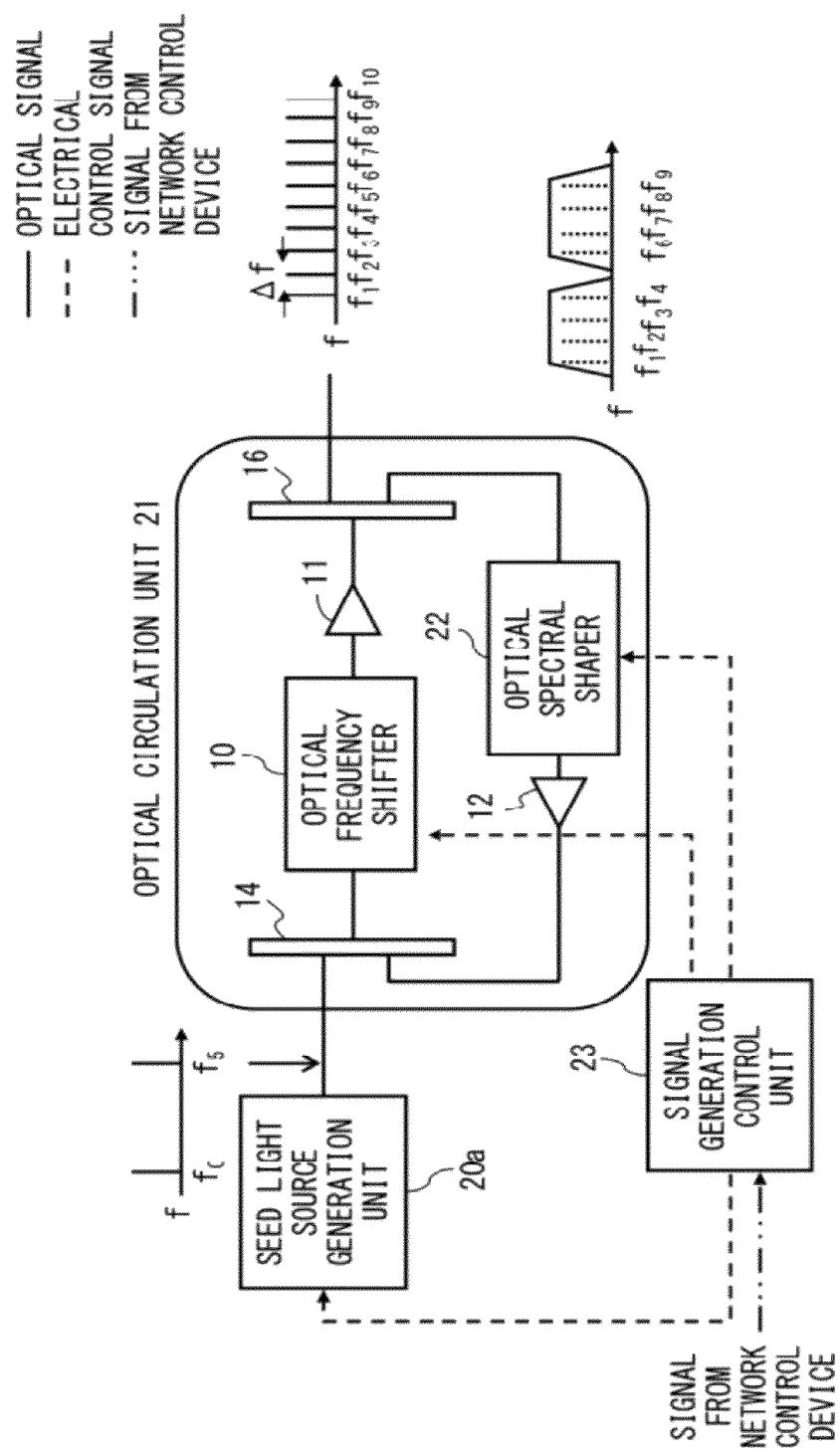
FIG. 11 illustrates a second configuration example (first part) according to the present embodiment.
Figure 13:
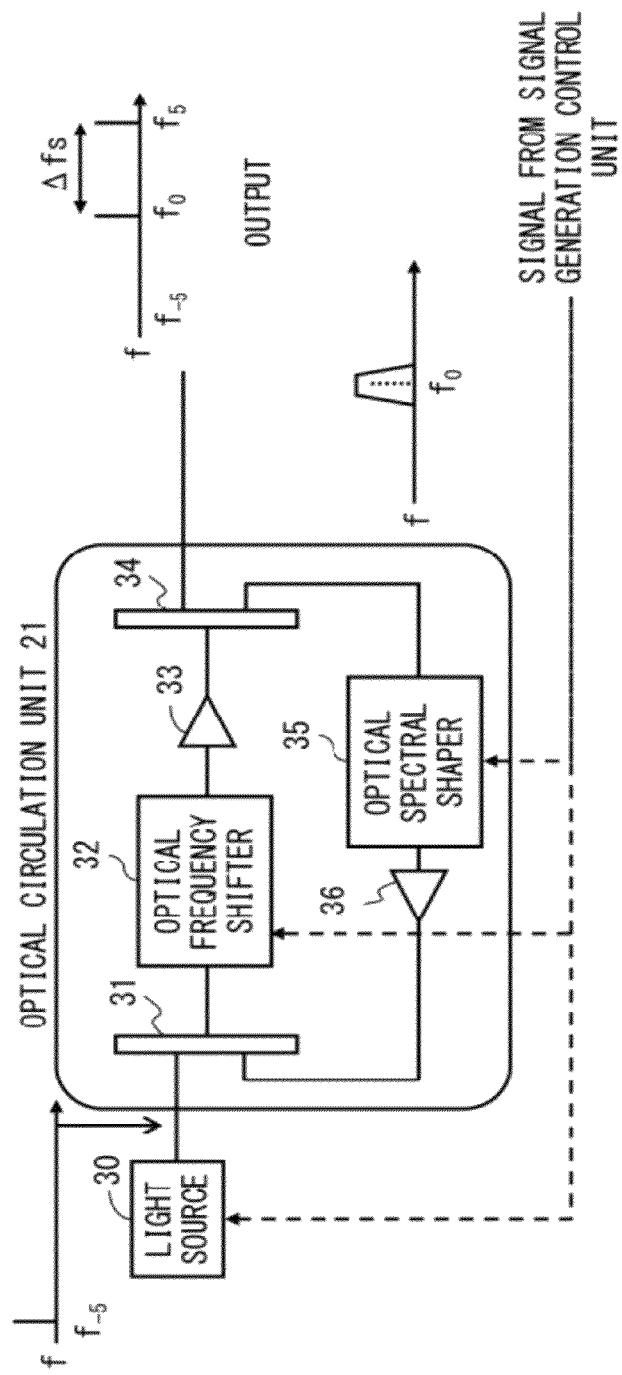
FIG. 13 illustrates the second configuration example (third part) according to the present embodiment.

FIGS. 11 through 13 illustrate examples of the second configuration according to the present embodiment.

In FIG. 11, constituents similar to those in FIG. 4 are denoted by the same numerical symbols, and explanations thereof will be omitted.

Continuous light having optical frequencies $f_0$ and $f_5$ are output from a seed light source generation unit (see FIG. 13) 20a that is capable of synchronizing frequencies. The optical spectral shaper 22 is set to transmit optical frequencies $f_1$ through $f_4$ and $f_6$ through $f_9$, and thereby a multi-wavelength light having the synchronized frequencies of $f_1$ through $f_{10}$ may be obtained. When a seed light source generation unit that has not synchronized the seed light beams of respective frequencies is used as a seed light source generation unit for generating continuous light having different frequencies, beams of circulating light generated from seed light having different frequencies are not synchronized in frequency while circulating light synchronized with the seed light of each frequency may be generated. Meanwhile, when the seed light source generation unit 20a outputs seed light having a plurality of frequencies and the respective frequencies of the seed light are synchronized, the light having other frequencies generated by the optical circulation unit 21 is generated in such a manner that it is synchronized with the seed light in frequency, and therefore light beams having synchronized frequencies may be obtained for light beams of all frequencies.

FIG. 12 is a graph having the horizontal axis representing the number of generated carriers and the vertical axis representing the OSNR of each carrier to depict the OSNR characteristics of a conventional technique and of the present configuration example. According to a conventional technique, when the number of generated carriers is eight, the OSNR is 40 dB, whereas according to the present configuration example, when the number of generated carriers is ten, the OSNR is almost the same as the OSNR according to the conventional technique. Accordingly, this graph illustrates that the present configuration example is capable of generating a greater number of frequency-synchronized carriers.

FIG. 13 illustrates a configuration example of a seed light source generation unit that generates a plurality of beams of seed light having synchronized frequencies.

A light source 30 inputs, to an optical circulation unit 37, light having frequency $f_{-5}$, which is lower by "$f_5-f_0=\Delta f_s$" than frequency $f_0$, with respect to frequency $f_5$ to be generated on the frequency grid. An optical circulation unit 37 has a configuration similar to the optical circulation unit 21 illustrated in FIG. 11, and includes optical couplers 31 and 34, an optical frequency shifter 32, optical amplifiers 33 and 36, and an optical spectral shaper 35. The optical frequency shifter 32 causes an optical frequency shift of $\Delta f_s (=f_0-f_{-5})$. The optical spectral shaper 35 is set to transmit only $f_0$. Thereby, seed light having synchronized frequencies $f_0$ and $f_5$ is generated as output. Frequencies to be generated by the light source 30, frequencies to be transmitted by the optical spectral shaper 35, and the amount of frequency to be shifted by the optical frequency shifter are controlled according to signals output from the signal generation controller.

Figure 14:
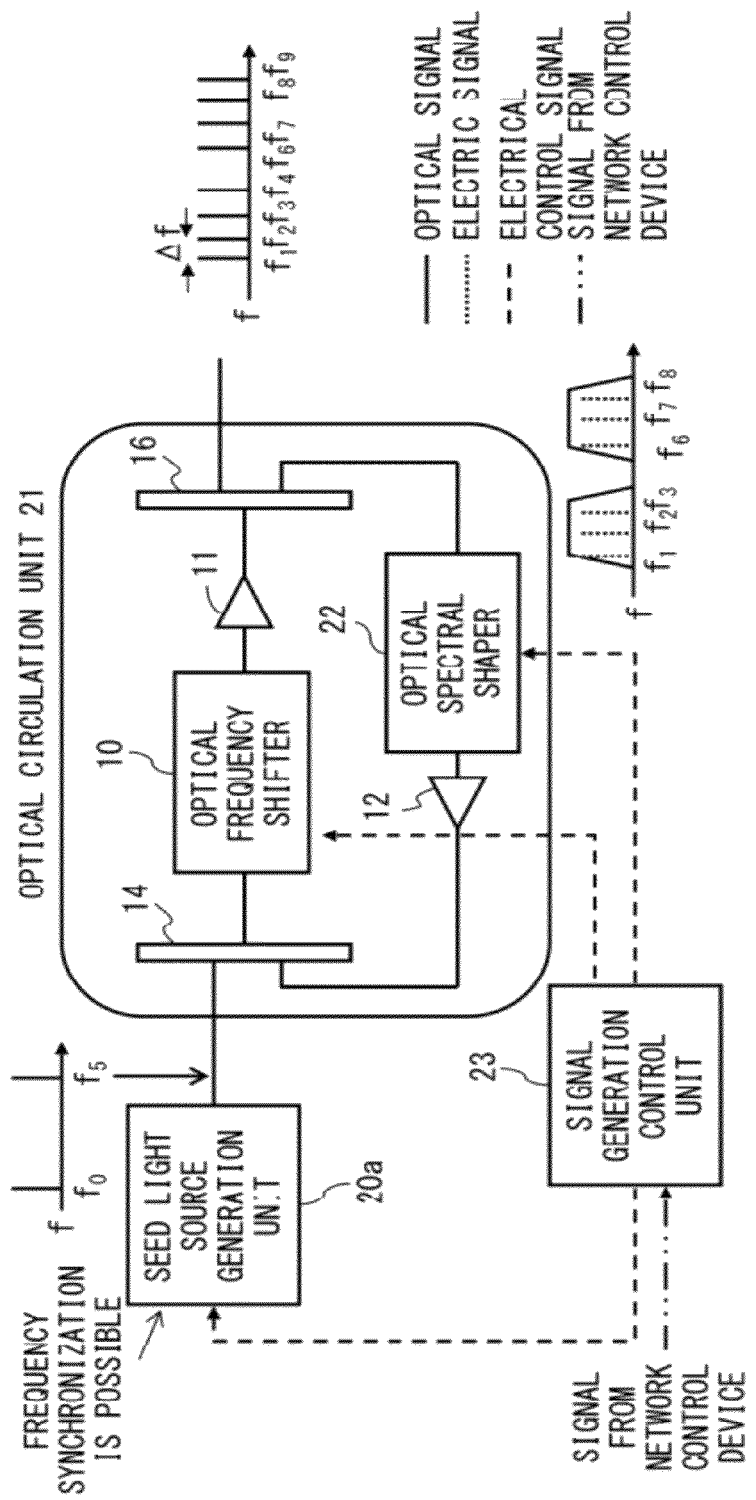
FIG. 14 illustrates a third configuration example according to the present embodiment.

FIG. 14 illustrates a third configuration example according to the present embodiment.

In FIG. 14, constituents similar to those in FIG. 11 are denoted by the same numerical symbols, and explanations thereof will be omitted.

Similarly to the configuration example illustrated in FIG. 11, the seed light source generation unit 20a capable of synchronizing frequencies generates light having frequencies $f_0$ and $f_5$. The optical spectral shaper 22 is set to transmit optical frequencies $f_1$ through $f_3$ and $f_6$ through $f_8$, and thereby a multi-wavelength light having synchronized frequencies $f_1$ through $f_4$ and $f_6$ through $f_9$ may be obtained. In the configuration example illustrated in FIG. 11, light having frequencies $f_1$ through $f_{10}$ is generated; however, the present configuration example does not generate frequency $f_5$ or $f_{10}$. By not generating light having these frequencies, two carrier groups having adjacent frequencies are generated, and a guard band is provided between them. For example, when different optical signal modulation schemes are applied to optical frequencies $f_1$ through $f_4$ and to optical frequencies $f_6$ through $f_9$, these carrier groups interfere with each other, deteriorating the signals. Accordingly, an optical frequency without optical signals, i.e., a guard band is provided between carriers employing different modulation schemes.

According to the configuration example illustrated in FIG. 14, the provision of the above guard band may be performed by controlling the transmission bandwidth of the optical spectral shaper 22. Further, the seed light source generation unit 20a generates light having two synchronized frequencies for generating two carrier groups, and accordingly the two carrier groups are synchronized in frequency.

Figure 15:
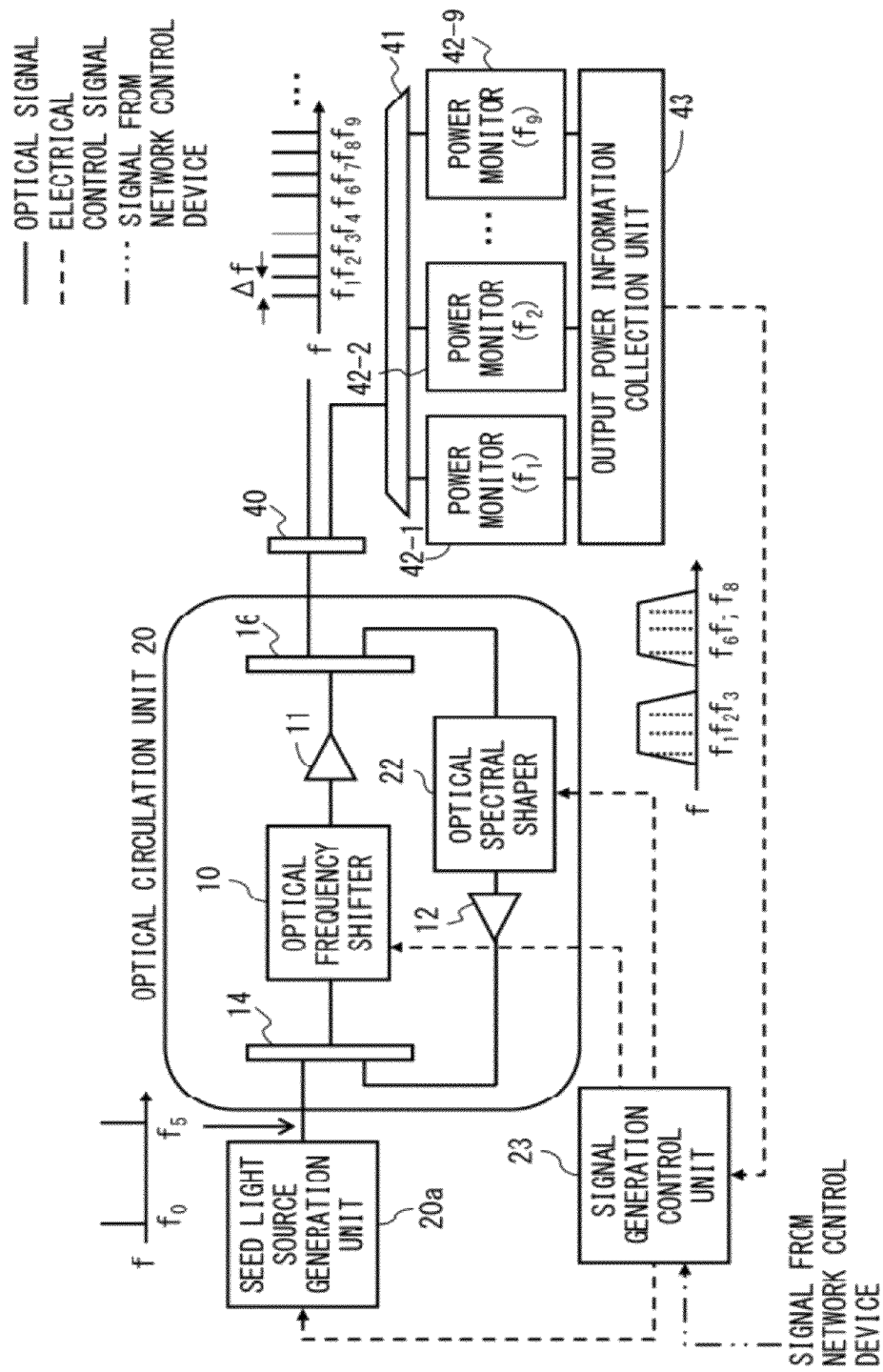
FIG. 15 illustrates a fourth configuration example (first part) according to the present embodiment.
Figure 16:
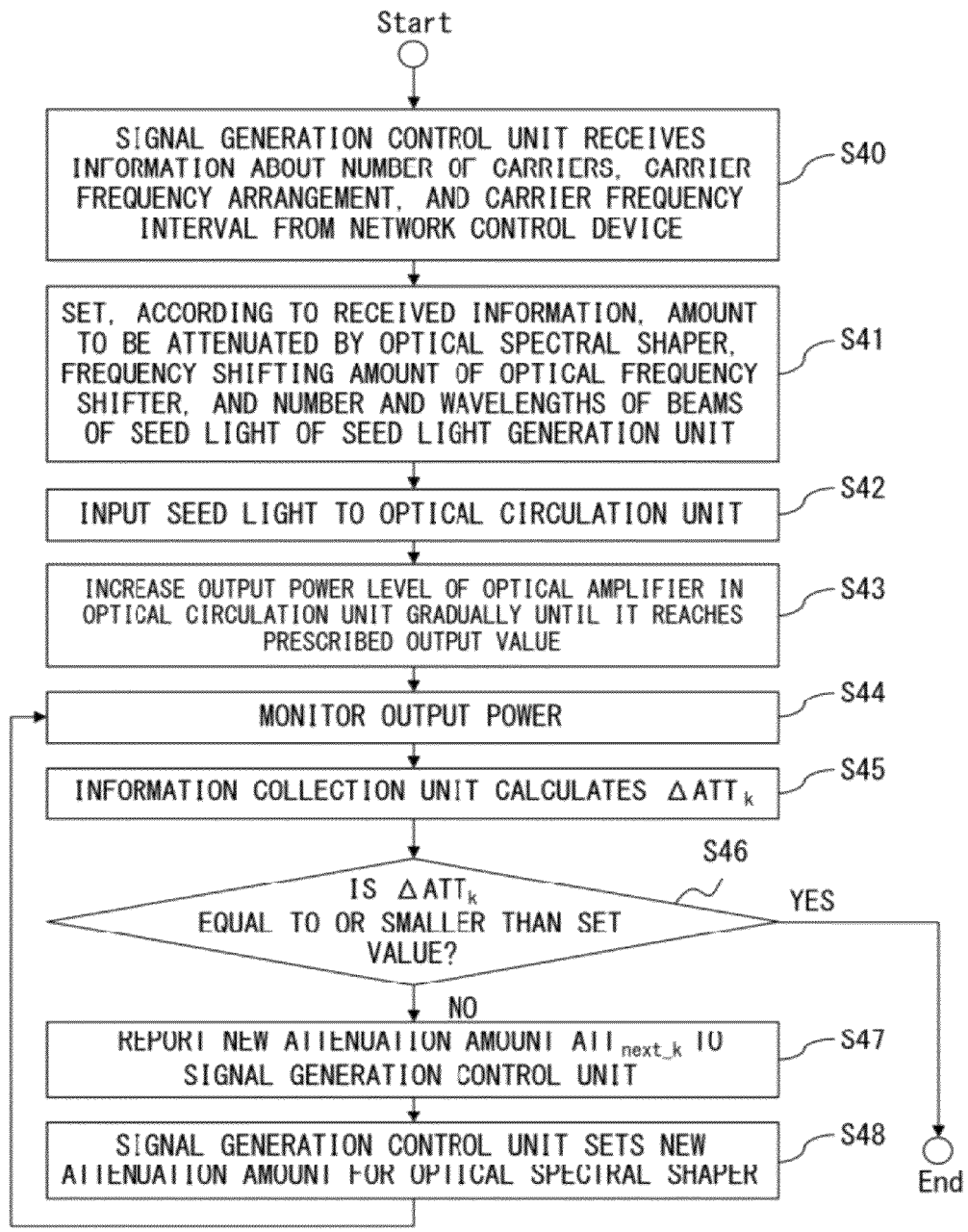
FIG. 16 illustrates the fourth configuration example (second part) according to the present embodiment.

FIGS. 15 and 16 explain a fourth configuration example according to the present embodiment.

In FIG. 15, constituents similar to those in FIG. 11 are denoted by the same numerical symbols, and explanations thereof will be omitted.

An optical coupler 40 separates light output from the optical circulation unit 21, and an optical demultiplexer 41 demultiplexes each carrier. Then, power monitors 42-1 through 42-9 monitor the power of each carrier generated. The power of each carrier being monitored is collected in an output power information collection unit 43 as information about the power of each frequency, and the amount to be attenuated by the optical spectral shaper 22 is calculated so that the optical power levels of the respective frequencies are even. The calculated result is reported to the signal generation controller 23, and the signal generation controller 23 instructs the optical spectral shaper 22 to set the attenuation amount for each frequency so that the optical power levels of the respective frequencies are even.

Thereby, it is possible to correct the unevenness of output power levels caused by the occurrences of residual elements in the optical frequency shifter 10, the wavelength dependency of the gain of optical amplifiers, and the like.

The calculation of the amount to be attenuated by the optical spectral shaper 22 is performed as below.

The total power of a plurality of carriers that are generated and monitored is obtained, the resultant value is divided by the total number of generated carriers, and the result is handled as a target power ($P_{target}$).

[Equation 7]

$$P_{total} = \sum_{k=1}^{N} P_{MON\_k}$$

$$P_{target} = \frac{P_{total}}{N}$$

$P_{total}$: Monitored value of the total power of generated carriers
$P_{MON\_k}$: Monitored value of power of carrier k
$P_{target}$: Target power
N: Total number of generated carriers It is assumed that the difference between power monitored values $P_{MON\_k}$ and $P_{target}$ of each carrier is $\Delta ATT$. As represented by the equations below, updated value $ATT_{next\_k}$, which is obtained by adding $\Delta ATT$ to current attenuation amount $ATT_{now\_k}$, is used so as to control the value to be attenuated by the optical spectral shaper 22.

$$\Delta ATT_k [dB] = P_{MON\_k}[dB] - P_{target}[dB]$$

$$ATT_{next\_k}[dB] = ATT_{now\_k}[dB] + \Delta ATT_k[dB]$$

$\Delta ATT_k$: Difference in target power levels between $P_{target}$ and power monitored value $P_{MON\_k}$ of each carrier
$ATT_{now\_k}$: Current value of amount to be attenuated at frequency k
$ATT_{next\_k}$: Updated value of amount to be attenuated at frequency k FIG. 16 is a flowchart illustrating operations performed by the configuration example illustrated in FIG. 15.

In step S40, the signal generation controller receives, from a network control device (not illustrated), information about the number of carriers, the carrier frequency arrangement, and the carrier frequency interval. In step S41, the signal generation controller sets, according to the received information, the amount to be attenuated by the optical spectral shaper, the frequency shifting amount of the optical frequency shifter, and the number and the wavelengths of beams of seed light of the seed light generation unit, and the like. In step S42, the seed light is input to the optical circulation unit. In step S43, the output level of the optical amplifier in the optical circulation unit is increased gradually until it reaches a prescribed output value.

In step S44, output power is monitored for each frequency. In step S45, the output power information collection unit calculates the $\Delta ATT_k$. In step S46, whether or not $\Delta ATT_k$ is equal to or smaller than a set value is determined. This determination is performed in order to skip processes when there is not a great difference between the attenuation amounts. The set value is used for determining whether or not the deviation of the optical power of each frequency is within a tolerable range, and is to be determined by the designer according to past experiences obtained through experiments. When the determination result in step S46 is Yes, the process is terminated. When the determination result in step S46 is No, the process proceeds to step S47, and the output power information collection unit reports new attenuation amount $ATT_{next\_k}$ to the signal generation controller. In step S48, the signal generation controller sets a new attenuation amount for the optical spectral shaper, and the process returns to step S44.

FIG. 17 illustrates a fifth configuration example according to the present embodiment.

In FIG. 17, constituents similar to those in FIG. 11 are denoted by the same numerical symbols, and explanations thereof will be omitted.

The output from the seed light source generation unit 20 is connected to a frequency selection switch 50. The frequency selection switch 50 is switched according to signals from the signal generation controller 23, and distributes light having different frequencies to a plurality of optical circulation units 21-1 through 21-3. The optical frequency shifter 10 of the optical circulation unit 21-1 generates light having a plurality of frequencies at frequency intervals of $\Delta f_b$, and the optical frequency shifter 10 of the optical circulation unit 21-3 generates light having a plurality of frequencies at frequency intervals of $\Delta f_c$.

As has been described, conventional techniques require a plurality of light sources to generate multi-wavelength light using different frequency intervals, whereas the present configuration example makes it possible for a single seed light source generation unit to generate multi-wavelength light using different carrier frequency intervals.

Figure 18:
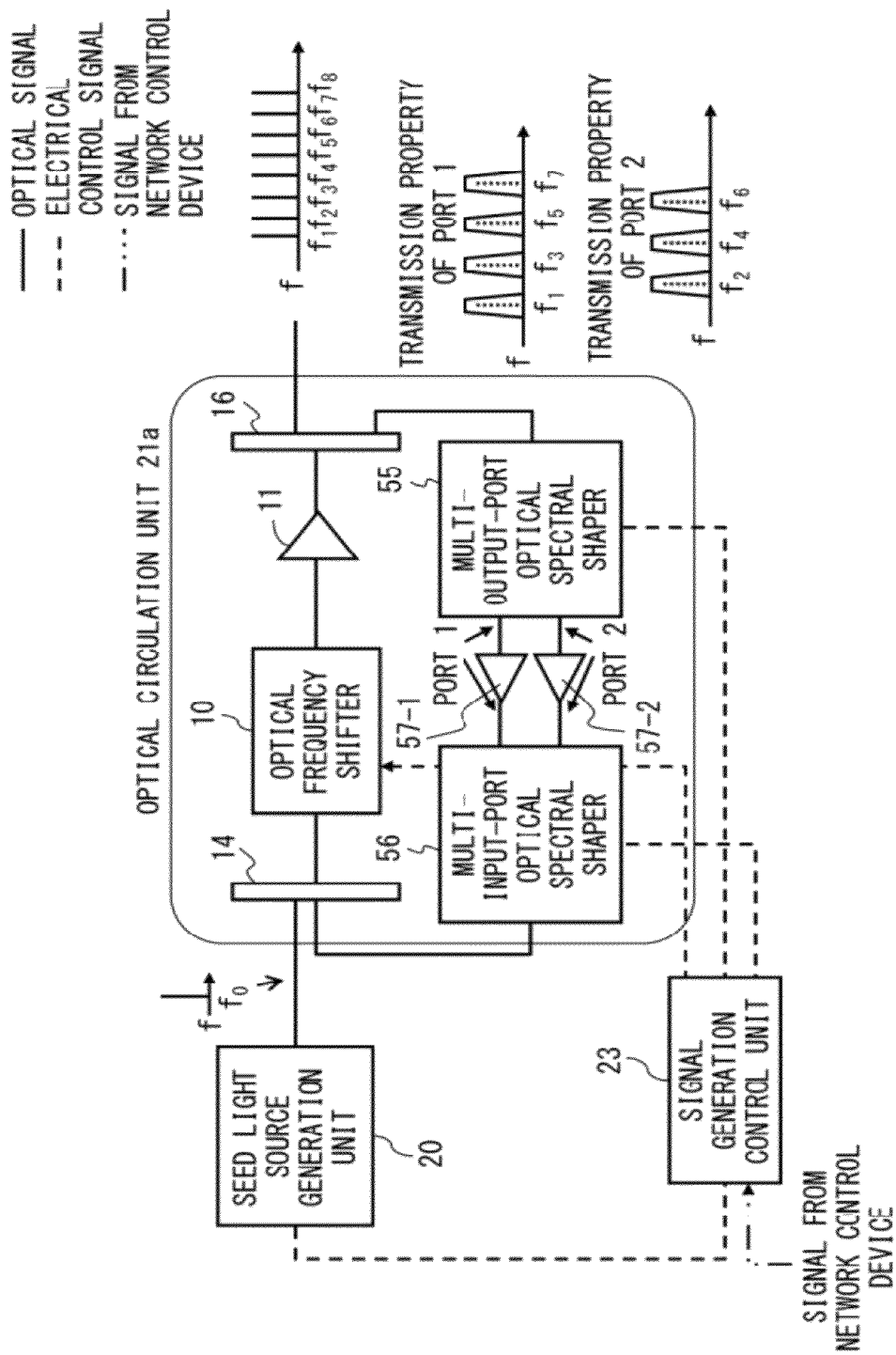
FIG. 18 illustrates a sixth configuration example according to the present embodiment.

FIG. 18 explains a sixth configuration example according to the present embodiment.

In FIG. 18, constituents similar to those in FIG. 11 are denoted by the same numerical symbols, and explanations thereof will be omitted.

The seed light source generation unit 20 outputs only light having optical frequency $f_0$ to an optical circulation unit 21a. A multi-output-port optical spectral shaper 55 and port 1 of a multi-input-port optical spectral shaper 56 are set to transmit only light having frequencies $f_1$, $f_3$, $f_5$, and $f_7$, and the port 2 thereof is set to transmit only light having frequencies $f_2$, $f_4$, and $f_6$. Optical amplifiers 57-1 and 57-2 are connected to ports 1 and 2, respectively. In the example illustrated in FIG. 18, the seed light has only one wavelength; however, it is also possible to make two or more beams of seed light input to the optical circulation unit 21a.

According to the above configuration, the number of beams of light that are input to the optical amplifiers 57-1 and 57-2 respectively decreases. Accordingly, the total power input to the optical amplifiers 57-1 and 57-2, respectively, may be reduced to half. Further, the optical amplifiers are capable of amplifying with ease the width of the power that has to be amplified. When optical power input to optical amplifiers is high and that power is amplified, the optical power becomes saturated, relatively increasing the level of noise. Accordingly, by reducing the power input to optical amplifiers, it is possible to relatively decrease the level of noise so as to improve the signal quality.

In addition, in the above configuration example, frequencies of light are sorted into an even-numbered-frequency group and an odd-numbered-frequency group. However, this manner of sorting is not essential, and any manner of sorting may be employed as long as power input to an optical amplifier is reduced. Also, according to the above configuration example, light having a plurality of frequencies are sorted into two groups, whereas they may be sorted into three or more groups. In such cases, power input to one optical amplifier is reduced more, which is further effective for improving the signal quality.

FIG. 19 explains a seventh configuration example according to the present embodiment.

In FIG. 19, constituents similar to those in FIG. 11 are denoted by the same numerical symbols, and explanations thereof will be omitted.

The seed light source generation unit includes an LD 60-1 that oscillates light having frequency $f_0$, and an LD 60-2 that oscillates light of frequency $f_6$, and an optical multiplexer 61 multiplexes those beams of light so as to input the resultant light to the optical circulation unit 21. The optical circulation unit 21 generates light of frequencies $f_1$ through $f_3$ and $f_6$ through $f_8$. An optical coupler 62 demultiplexes the output from the optical circulation unit 21, and extracts only light having frequency $f_3$ by using an optical filter 63. The extracted light having frequency $f_3$ is input to a phase synchronization unit 64 in order to synchronize, in phase, optical frequencies $f_3$ and $f_5$. Thereby, the frequency synchronization and the phase synchronization may be realized between the frequencies $f_1$ through f3 and the frequencies $f_6$ through $f_8$.

In other words, the optical circulation unit 21 generates light having optical frequency $f_3$ from the light having optical frequency $f_0$, and thus the light having optical frequency $f_0$ and the light having optical frequencies $f_1$ through $f_3$ are synchronized both in frequency and phase. Similarly, the light having frequencies $f_6$ through $f_8$ is synchronized with the light having optical frequency $f_5$ both in frequency and phase. Accordingly, by synchronizing, in phase, the light having optical frequency $f_3$ and the light having optical frequency $f_5$, the light having optical frequencies $f_1$ through $f_3$ and the light having optical frequencies $f_6$ through $f_8$ may be synchronized both in frequency and phase. In this example, the light having optical frequency $f_3$ and the light having optical frequency $f_5$ are synchronized in phase, however, optical frequencies $f_0$ through $f_2$ may be used instead of optical frequency $f_3$, and optical frequencies of $f_6$ through $f_8$ may also be used instead of optical frequency $f_5$. As methods of the phase synchronization, a method in which an injection-locking method is used, a method in which an optical phase lock loop circuit is used, etc., are possible.

For information about an injection-locking method, refer to the documents below. According to an injection-locking method, light having center frequency $f_i$ output from the Master laser is used as the seed light, and a Slave laser oscillates so as to obtain optical output that has been phase synchronized with the seed light. Frequency shift amount Δf varies depending upon various parameters of the seed light and the Slave laser.

1) pp. 230-233 in "Handoutai-Laser-No-Kiso" (fundamental knowledge of semiconductor laser) written by Toshiaki SUHARA and published by KYORITSU SHUPPAN CO., LTD.
2) S. Kobayashi and T. Kimura, "Injection Locking in AlGaAs Semiconductor Laser," IEEE J. Quantum Electron. QE-17, 681 (1981).

For information about methods in which an optical phase lock loop circuit is used, refer to the document below.

According to a method in which an optical phase lock loop circuit is used, the difference between frequencies output from a Master laser and a Slave laser and the difference between frequencies and phases of the phase difference signal and the local oscillators are compared, and a feedback operation is performed in such a manner that those differences become zero.

M. Prevedelli, T. Freegarde and T. W. Hansch, "Phase Locking of grating-tuned diode lasers", Appl. Phys. B. 60, 5241 (1995)

Figure 20:
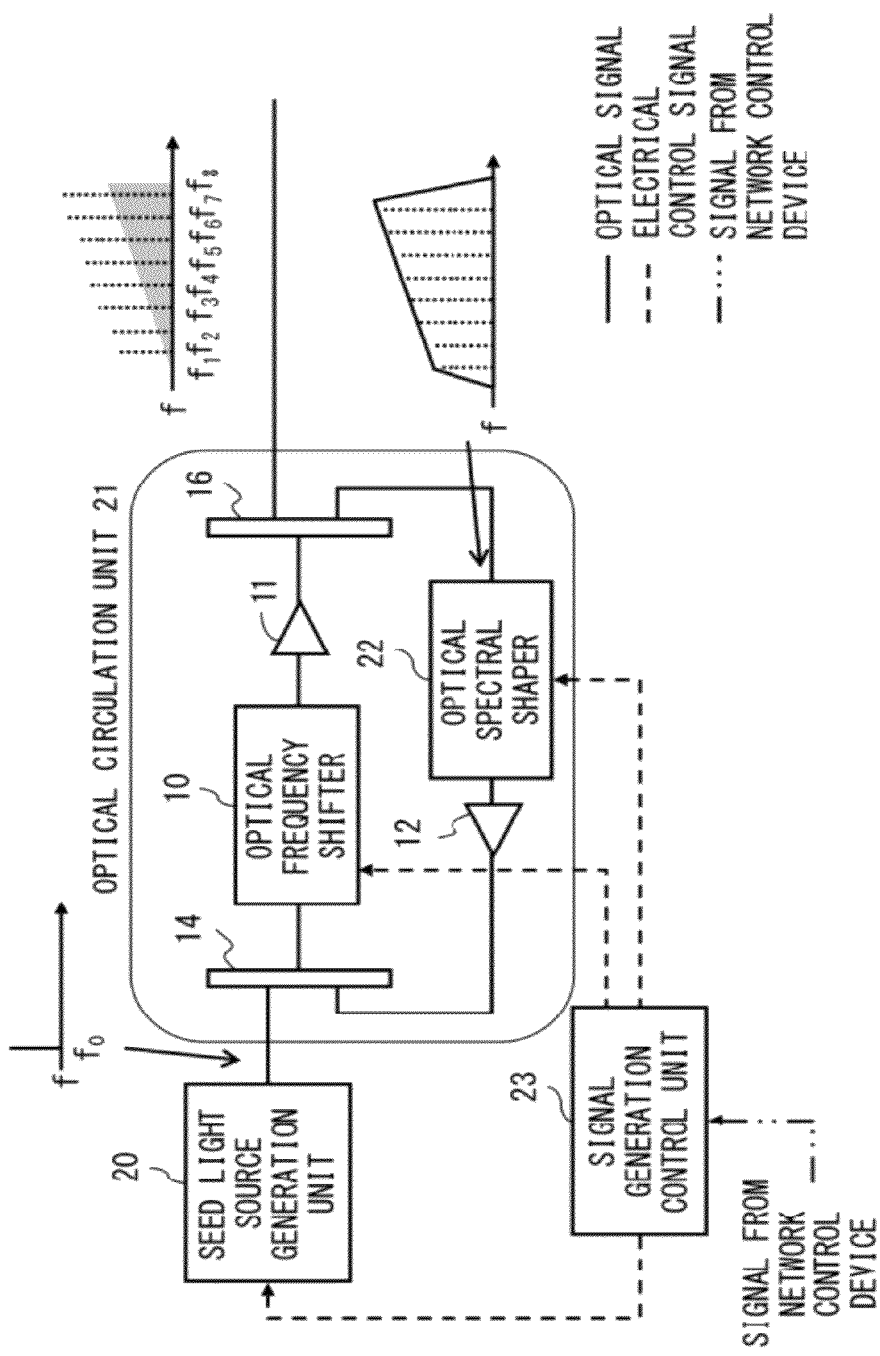
FIG. 20 illustrates an eighth configuration example according to the present embodiment.

FIG. 20 illustrates an eighth configuration example according to the present embodiment.

In FIG. 20, constituents similar to those in FIG. 11 are denoted by the same numerical symbols, and explanations thereof will be omitted.

In the configuration example illustrated in FIG. 20, the amount to be attenuated by the optical spectral shaper 22 in the optical circulation unit 21 is decreased as the optical frequency increases in order to improve the quality of optical signals on the side where frequencies have a large number of times of circulation. It is assumed that light having frequency $f_0$ was output from the seed light source generation unit 20 and that the optical circulation unit 21 generated light having frequencies $f_1$ through $f_8$. Each time the light circulates through the optical circulation unit 21, frequency $f_1$ through frequency $f_8$ are generated sequentially. However, when the light circulates through the optical circulation unit 21, the light passes through the optical frequency shifter 10, the optical spectral shaper 22, the optical amplifiers 11 and 12 many times, and as the light circulates more times, the light involves more noise. In such a case, by maintaining the light intensity at a high level in response to accumulated noise, the ratio of the light intensity to noise is also kept high so that the OSNR of the optical signal may be made consistent. Accordingly, in the present configuration example, the attenuation amount is set to be greater for light having a smaller number of times of circulation, and is set to become smaller as the number of times of circulation through the optical spectral shaper 22 increases.

Figure 21:
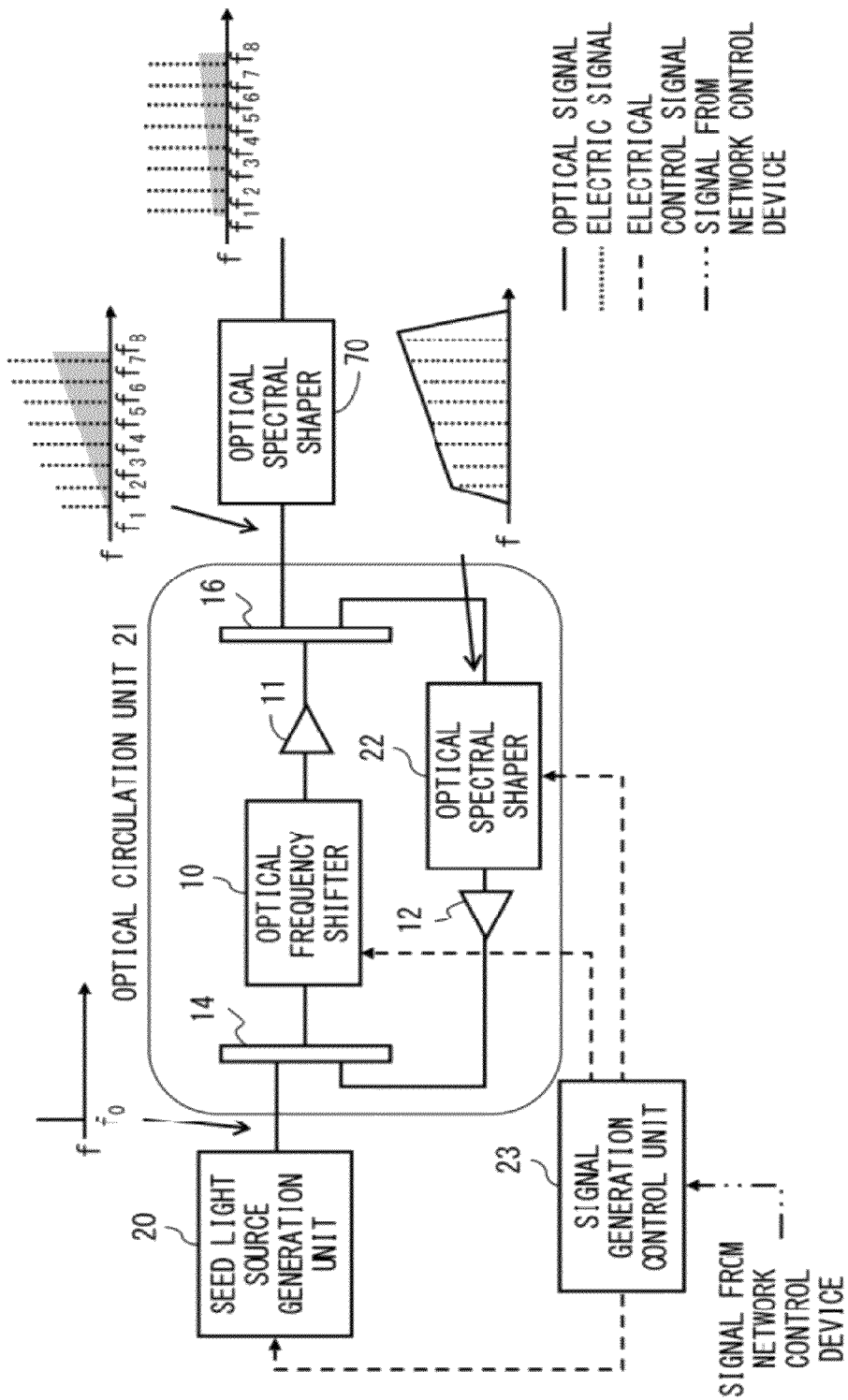
FIG. 21 illustrates a ninth configuration example according to the present embodiment.

FIG. 21 illustrates a ninth configuration example according to the present embodiment.

In FIG. 21, constituents similar to those in FIG. 11 are denoted by the same numerical symbols, and explanations thereof will be omitted.

In this configuration, in addition to the configuration illustrated in FIG. 20, an optical spectral shaper 70 is included on the output side of the optical circulation unit 21 in order to adjust the power levels of respective carriers to even levels. In the case of FIG. 20, the optical spectral shaper 22 attenuated a large amount of frequencies having a smaller number of times of circulation, and the attenuation amount was reduced as the number of times of circulation increased. In this case, the intensity of an optical signal having a smaller number of times of circulation is low, and the light intensity increases as the number of times of circulation increases. In other words, light intensities vary depending upon frequencies, and the shape of the spectrum is sloped. This improves the OSNR; however, differences among light intensities cause an unevenness of frequencies when a light reproduction process or an amplification process are performed for each frequency in a later stage device in the present embodiment. Accordingly, the present configuration example includes the optical spectral shaper 70 on the output side of the optical circulation unit 21 in order to adjust the attenuation amount for each frequency so that the light intensities of all frequencies are almost even. Noise is involved in optical signals in the optical circulation unit 21, and if light intensities are adjusted on the output side of the optical circulation unit 21, light intensities of optical signals involving the noise may be adjusted. Thereby, it is possible to adjust light intensities to even intensities while maintaining the OSNR for each frequency.

Figure 22:
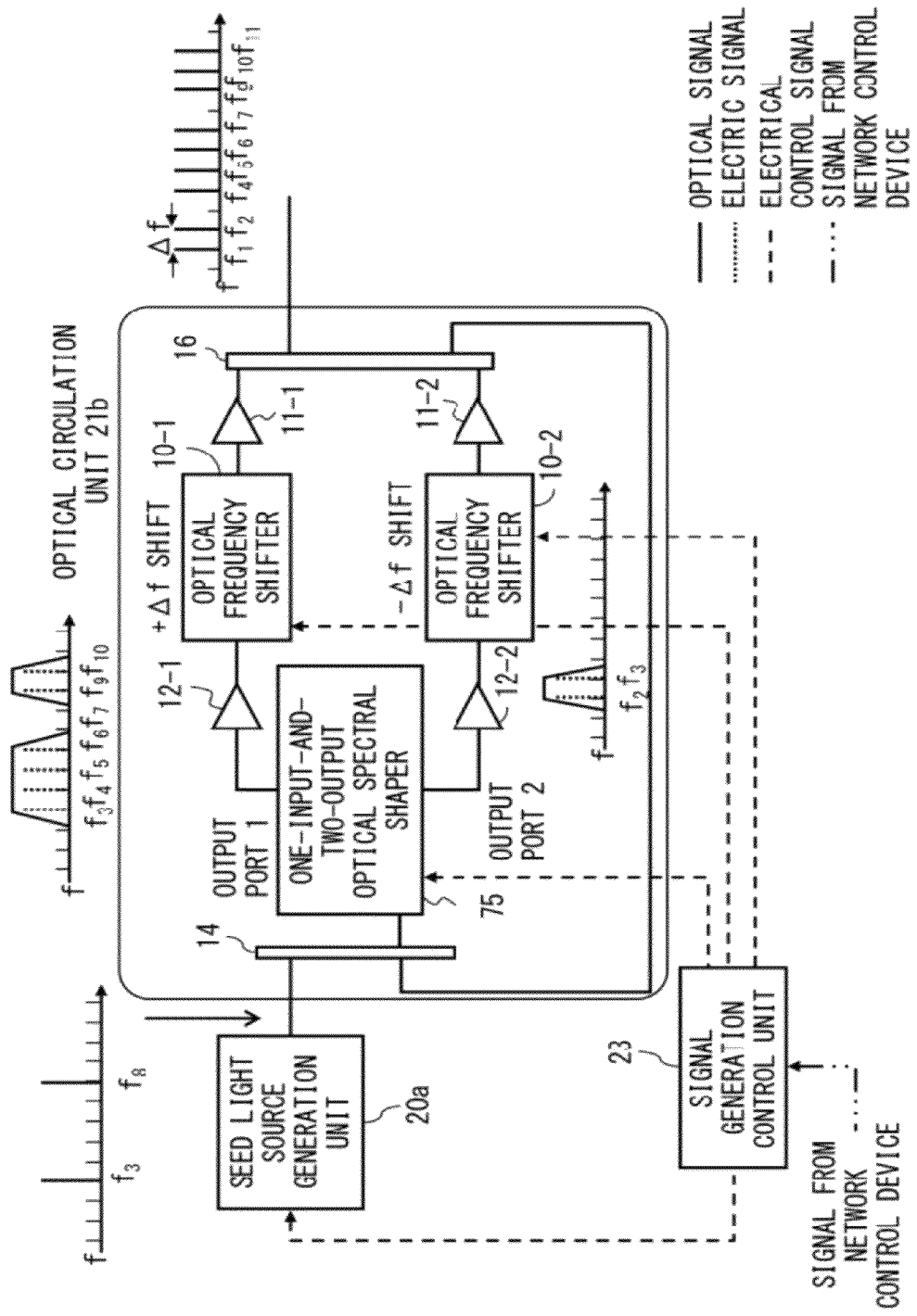
FIG. 22 illustrates a tenth configuration example (first part) according to the present embodiment.

FIGS. 22 and 23 illustrate a tenth configuration example according to the present embodiment.

In FIG. 22, constituents similar to those in FIG. 11 are denoted by the same numerical symbols, and explanations thereof will be omitted.

The seed light source generation unit 20a outputs light having optical frequencies $f_3$ and $f_8$. The optical circulation unit 21b is provided with a one-input-and-two-output optical spectral shaper 75. Through the output port 1 of the one-input-and-two-output optical spectral shaper 75, optical frequencies $f_3$ through $f_6$ and $f_9$ and $f_{10}$ are output while through the output port 2, optical frequencies $f_2$ and $f_3$ are output. An optical frequency shifter 10-1 causes a frequency shift of $+\Delta f$, and an optical frequency shifter 10-2 causes a frequency shift of $-\Delta f$. As has been described, in order to cause a negative frequency shift, not only a signal of frequency $\Delta f$, but also a signal obtained by shifting the phase of this signal by $-\pi/2$ is input as a driving signal to an optical SSB modulator that constitutes the optical frequency shifter. By the above configuration, a multi-wavelength light corresponding to three carrier groups of optical frequencies $f_1$ and $f_2$, $f_4$ through $f_7$, and $f_2$ through $f_{11}$ may be obtained from two beams of seed light.

If multi-wavelength light corresponding to three carrier groups is to be obtained using only positive frequency shifting, three beams of seed light having three frequencies are required, while the configuration example according to the present embodiment needs only two beams of light having two frequencies. In other words, the use of negative frequency shifting enables the reduction in the number of beams of seed light.

FIG. 23 illustrates a configuration example of a one-input-two-output optical spectral shaper used in FIG. 22.

In the case illustrated in FIG. 22, the one-input-two-output optical spectral shaper has to output light having frequency $f_3$ both to output port 1 and output port 2. Accordingly, light having frequency $f_3$ is output from port 2 of a three-output optical spectral shaper 80, and that light is demultiplexed by an optical demultiplexer 82, and thereafter the resultant beams of the light are input to optical multiplexers 81 and 83.

In other words, the frequencies to be transmitted through output ports 1 through 3 of the optical spectral shaper 80 are set as below.
Port 1: $f_4$ through $f_6$, $f_9$ and $f_{10}$
Port 2: $f_3$
Port 3: $f_2$ The optical multiplexer 81 multiplexes the beams of light having frequencies $f_3$ through $f_6$, $f_9$ and $f_{10}$ so as to output the resultant light to output port 1, and the optical multiplexer 83 multiplexes the beams of light having frequencies $f_2$ and $f_3$ so as to output the resultant light to output port 2.

FIGS. 24 through 28 illustrate configuration examples of a seed light source generation unit.

In FIG. 24, the seed light source generation unit includes a plurality of fixed-wavelength (frequency) light sources $LD_0$ through $LD_N$, and an optical multiplexer 85 in order to turn on and off the light sources $LD_0$ through $LD_N$, and controls the output power according to information from the signal generation controller.

In FIG. 25, the seed-light generation unit includes a plurality of fixed-wavelength (frequency) light sources $LD_0$ through $LD_M$, optical attenuators 86-1 through 86-M+1, and an optical multiplexer 87. The optical attenuators 86-1 through 86-M+1 are arranged on the output sides of the light sources $LD_0$ through $LD_M$, respectively. The seed light source generation unit controls the amount to be attenuated by the optical attenuators 86-1 through 86-M+1 according to control signals from the signal generation controller, controls the output power, and turns on and off the output light.

Figure 26:
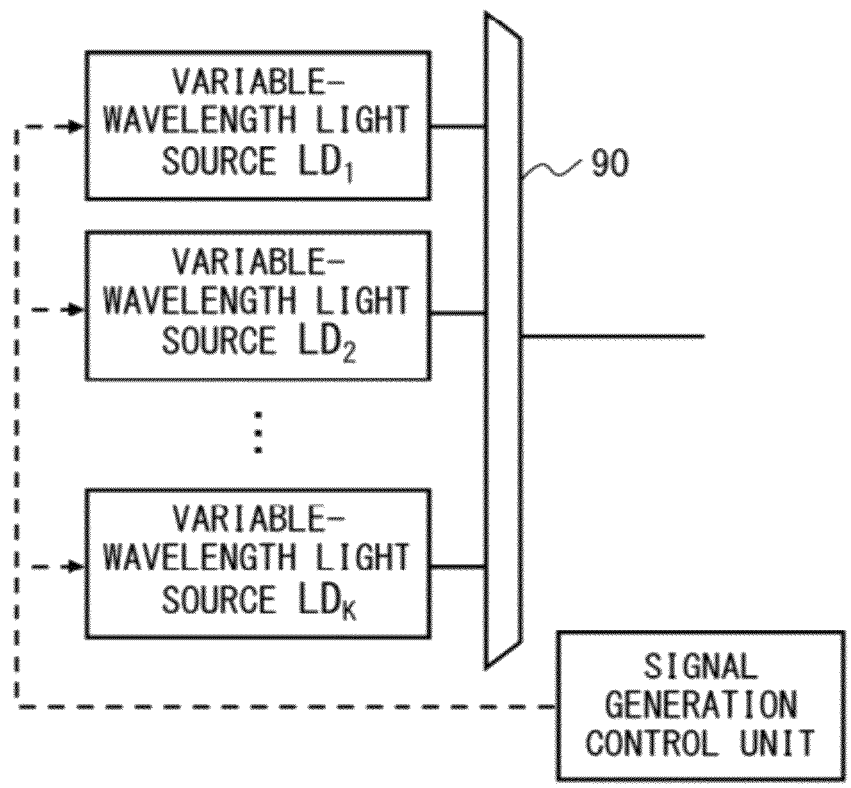
FIG. 26 illustrates a configuration example (third part) of the seed light source generation unit.

In FIG. 26, the seed light source generation unit includes at least one variable-wavelength (frequency) light source $LD_1$ through $LD_K$, and an optical multiplexer 90, and sets whether the light sources $LD_1$ through $LD_K$ are set to ON or OFF, sets the wavelengths (frequencies), and controls the output power according to information from the signal generation controller.

In FIG. 27, the seed light source generation unit includes a plurality of variable-wavelength (frequency) light sources $LD_1$ through $LD_K$, optical attenuators 91-1 through 91-K, and an optical multiplexer 92. The optical attenuators 91-1 through 91-K are arranged on the output sides of the variable-wavelength light sources $LD_1$ through $LD_K$. The seed light source generation unit controls the amount to be attenuated by the optical attenuators 91-1 through 91-K, controls the output power for each frequency, and turns ON and OFF the output light using the optical attenuators 91-1 through 91-K.

Figure 28:
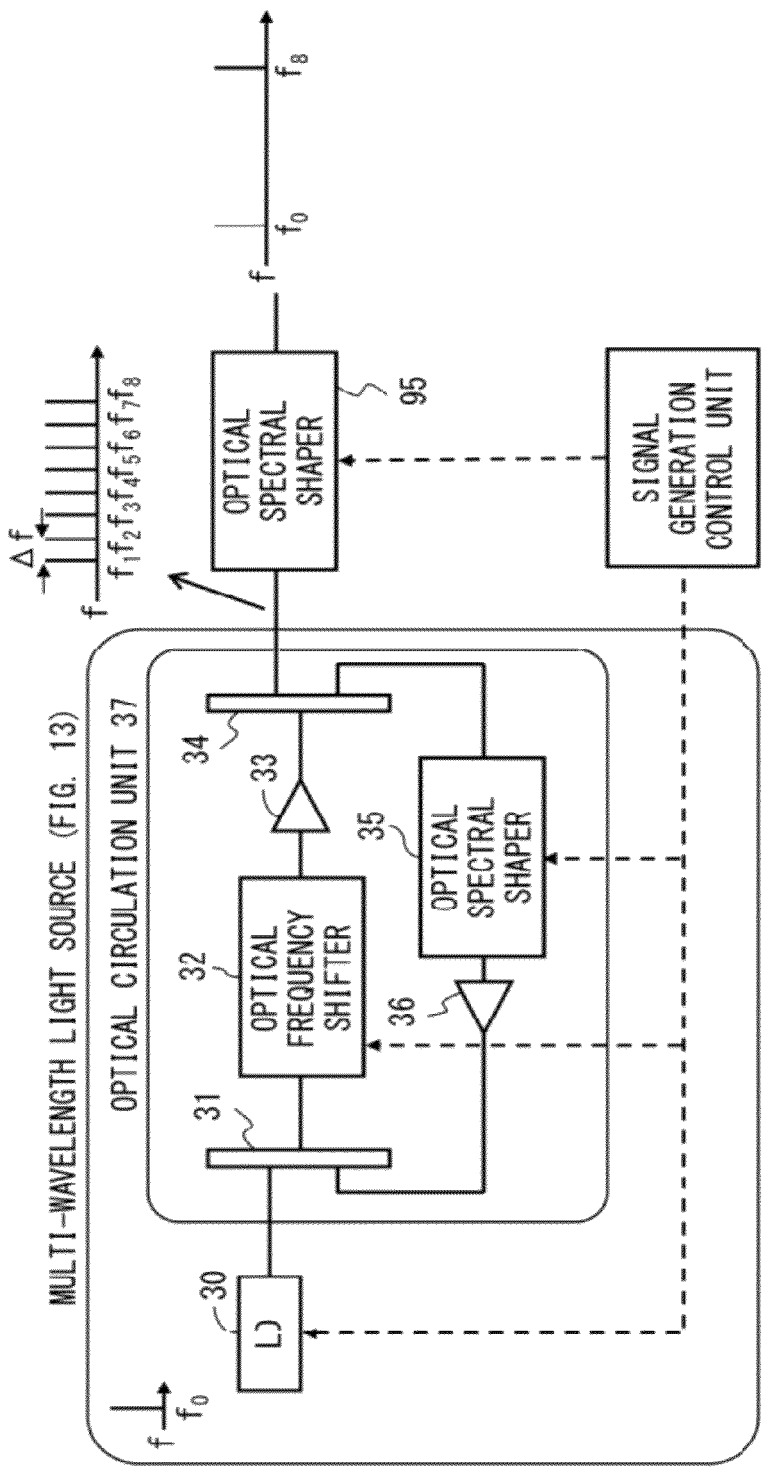
FIG. 28 illustrates a configuration example (fifth part) of the seed light source generation unit.

In FIG. 28, the seed light source generation unit includes the multi-wavelength light source illustrated in FIG. 13 (however, the output from the LD 30 has only $f_0$), and an optical spectral shaper 95, and is capable of generating multi-wavelength light ($f_1$ through $f_8$) according to information from the signal generation controller, and outputting necessary seed light (for example, $f_1$ and $f_8$) by using the optical spectral shaper 95 on the output side of the optical circulation unit 37. By using the configuration illustrated in FIG. 28, a plurality of beams of seed light having synchronized frequencies may be obtained.

FIG. 29 illustrates an optical transmitter that uses a multi-wavelength light source according to the present embodiment.

In an optical transmitter using a multi-wavelength light source 100 according to the present embodiment, a demultiplexer 104 demultiplexes multi-wavelength light output from the multi-wavelength light source 100 into beams of various wavelengths, and modulators 101-1 through 101-n provided for each wavelength modulate the beams. Optical attenuators 102-1 through 102-n provided for each wavelength adjust the light intensities of optical signals from the modulators 101-1 through 101-n, and those optical signals are multiplexed by a multiplexer 103 so as to be output as wavelength-multiplexed light.

Figure 30:
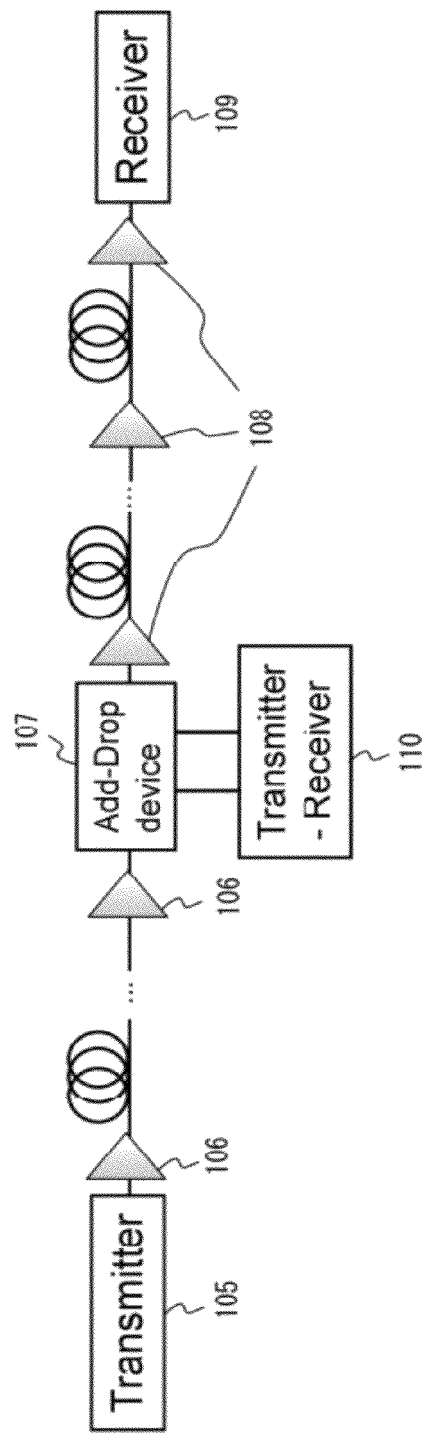
FIG. 30 illustrates an optical communication system to which the present embodiment is applied.

FIG. 30 illustrates an optical communication system to which the present invention is applied.

An optical signal transmitted from an optical transmitter 105 using a multi-wavelength light source according to the present embodiment is subject to amplification by amplifiers 106 so as to be transferred. In an add-drop device 107, an optical signal having a specific wavelength is dropped to a transmitter-receiver 110, and an optical signal having a prescribed wavelength output from the transmitter-receiver 110 is added to an optical signal output from the amplifier 106. Outputs from the add-drop device 107 are received by a receiver 109 via amplifiers 108.

The signal generation controller can be comprised by circuit, processor which run a program, or Field-Programmable Gate Array (FPGA).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment (s) of the present invention has (have) been described in detail, it should be understood that the various changes, substitutions, and alterations could be made hereto without departing from the spirit and scope of the invention.

What is claimed is:

1. A multi-wavelength light source, comprising:
an optical frequency shifter to shift a frequency of input light by an amount of frequency shift that has been set;
a seed light source generation unit to input light having a plurality of different frequencies to the optical frequency shifter;
a circulation path to make output from the optical frequency shifter circulate to an input side of the optical frequency shifter;
an optical spectral shaper capable of setting an amount of attenuation individually for light of each frequency output from the optical frequency shifter so as to transmit only light of a set frequency; and
a controller to control a frequency output from the seed light source generation unit and the amount of attenuation by the optical spectral shaper on the basis of at least one of a number of carriers, a carrier arrangement, and a carrier frequency interval.

2. The multi-wavelength light source according to claim 1, wherein:
the controller controls power of light output from the seed light source generation unit.

3. The multi-wavelength light source according to claim 1, wherein:
the controller controls the amount of frequency shift of the optical frequency shifter.

4. The multi-wavelength light source according to claim 1, wherein:
output power of each beam of light output from the seed light source generation unit or an amount of frequency shift of the optical frequency shifter is further controlled on the basis of at least one of a number of carriers, a carrier arrangement, and a carrier frequency interval.

5. The multi-wavelength light source according to claim 1, wherein:
the seed light source generation unit outputs beams of light having a plurality of different frequencies, and the beams of light having the plurality of different frequencies are frequency-synchronized with each other.

6. The multi-wavelength light source according to claim 5, wherein:
beams of light having a plurality of frequencies output from the multi-wavelength light source are frequency-synchronized with each other.

7. The multi-wavelength light source according to claim 1, wherein:
an amount of attenuation by the optical spectral shaper increases as an absolute value of a frequency difference from a seed light increases.

8. The multi-wavelength light source according to claim 7, wherein:
a second optical spectral shaper is provided to handle, as input to the second optical spectral shaper, light output from the optical frequency shifter; and
the second optical spectral shaper controls an amount of attenuation of light of each frequency in such a manner that optical power levels of light of a plurality of frequencies are generally even.

9. The multi-wavelength light source according to claim 1, wherein:
the optical spectral shaper is provided on the circulation path, handles, as input to the optical spectral shaper, output from the optical frequency shifter, and makes its output input to the optical frequency shifter.

10. The multi-wavelength light source according to claim 1, comprising:
a power monitor to detect optical power of each frequency is provided at a position to which light output from the optical frequency shifter is input, wherein:
the controller controls an amount attenuated by the optical spectral attenuator so that power levels of respective frequencies are generally even on the basis of a power of light of each frequency detected by the power monitor.

11. A multi-wavelength light source, comprising:
a seed light source generation unit to output light having a plurality of frequencies;
a frequency selection switch to demultiplex output from the light source into beams of light of each frequency; and
a plurality of units each including a circulation path having the optical frequency shifter and the optical spectral shaper according to claim 1, to receive light from the frequency selection switch, wherein:
respective optical frequency shifters of the plurality of units shift frequencies of input light by amount of frequency shifts different from each other.

12. The multi-wavelength light source according to claim 1, wherein:
the seed light source generation unit comprises:
a second optical frequency shifter to shift a frequency of input light by an amount of frequency shift that has been set;
a light source to input light having a single frequency to the second optical frequency shifter;
a second circulation path to make output from the second optical frequency shifter circulate to an input side of the second optical frequency shifter;
a second optical spectral shaper that is provided on the second circulation path and that is capable of setting an amount of attenuation individually for light of each frequency output from the second optical frequency shifter so as to transmit only light of a set frequency, wherein:
the seed light source generation unit generates light having a plurality of frequencies that are frequency synchronized.

13. The multi-wavelength light source according to claim 1, wherein:
light having a plurality of frequencies propagating in the circulation path is divided into a plurality of groups, and an optical amplifier and an optical spectral shaper are provided for light of each group.

14. The multi-wavelength light source according to claim 1, wherein:
the seed light source generation unit includes a plurality of laser diodes to emit light having different frequencies; and
beams of light oscillated by the plurality of laser diodes are phase-synchronized.

15. The multi-wavelength light source according to claim 1, wherein:
the optical frequency shifter comprises:
a first optical frequency shift unit to shift, to a higher frequency side, a frequency of input light by an amount of frequency shift that has been set; and
a second optical frequency shift unit to shift, to a lower frequency side, a frequency of input light by an amount of frequency shift that has been set, wherein:
the optical spectral shaper adjusts an amount of attenuation of light of each frequency, and assigns light of each frequency to the first optical frequency shift unit and the second optical frequency shift unit.

16. The multi-wavelength light source according to claim 1, wherein:
the seed light source generation unit comprises:
a plurality of laser diodes to output beams of light having different frequencies; and
an optical multiplexer to multiplex beams of light output from the plurality of laser diodes.

17. The multi-wavelength light source according to claim 16, wherein:
an optical attenuator is provided to each of the plurality of laser diodes.

18. The multi-wavelength light source according to claim 16, wherein:
the laser diodes are capable of varying the frequencies to be output.

19. An optical transmitter, comprising:
the multi-wavelength light source according to claim 1.

20. An optical communication system, comprising:
the optical transmitter according to claim 19.

* * * * *